(12) United States Patent
Feng et al.

(10) Patent No.: US 7,696,536 B1
(45) Date of Patent: Apr. 13, 2010

(54) SEMICONDUCTOR METHOD AND DEVICE

(75) Inventors: Milton Feng, Champaign, IL (US); Nick Holonyak, Jr., Urbana, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 519 days.

(21) Appl. No.: 11/496,161

(22) Filed: Jul. 31, 2006

Related U.S. Application Data

(63) Continuation-in-part of application No. 10/646,457, filed on Aug. 22, 2003, now abandoned.

(51) Int. Cl.
 *H01L 29/74* (2006.01)
(52) U.S. Cl. ............... 257/197; 257/205; 257/E29.076; 438/204
(58) Field of Classification Search .................... 257/47, 257/183, 197, 205, 273, 517, 565, 575, E31.069, 257/E29.07, E29.071, E29.076; 438/170, 438/189, 202, 204, 235
See application file for complete search history.

(56) References Cited

U.S. PATENT DOCUMENTS

| | | | |
|---|---|---|---|
| 2,569,347 A | 9/1951 | Shockley | |
| 4,485,391 A | 11/1984 | Poulain et al. | 357/19 |
| 4,710,936 A | 12/1987 | Shibata et al. | 372/45 |
| 4,845,535 A | 7/1989 | Yamanishi et al. | 315/172 |
| 4,958,208 A | 9/1990 | Tanaka | 357/34 |
| 5,003,366 A | 3/1991 | Mishima et al. | 357/34 |
| 5,239,550 A | 8/1993 | Jain | 372/45 |
| 5,293,050 A | 3/1994 | Chapple-Sokol et al. | 257/17 |
| 5,334,854 A | 8/1994 | Ono et al. | 257/13 |
| 5,389,804 A | 2/1995 | Yokoyama et al. | 257/197 |
| 5,399,880 A * | 3/1995 | Chand | 257/21 |
| 5,414,273 A | 5/1995 | Shimura et al. | 257/17 |
| 5,588,015 A | 12/1996 | Yang | 372/45.012 |
| 5,684,308 A | 11/1997 | Lovejoy et al. | 257/184 |
| 5,723,872 A | 3/1998 | Seabaugh et al. | 257/25 |

(Continued)

FOREIGN PATENT DOCUMENTS

JP 61231788 10/1986

(Continued)

OTHER PUBLICATIONS

F. Jain, C. Chung, R. LaComb and M. Gokhale, "Resonant Tunneling Transistor Lasers: A New Approach To Obtain Multi-State Switching And Bistable Operation", International Journal Of Infrared And Millimeter Waves, Springer, Dordrecht, NL, vol. 14, No. 6, pp. 1311-1322, Jun. 1993.

(Continued)

*Primary Examiner*—W. David Coleman
*Assistant Examiner*—Su C Kim
(74) *Attorney, Agent, or Firm*—Martin Novack

(57) ABSTRACT

A method for enhancing operation of a bipolar light-emitting transistor includes the following steps: providing a bipolar light-emitting transistor having emitter, base, and collector regions; providing electrodes for coupling electrical signals with the emitter, base, and collector regions; and adapting the base region to promote carrier transport from the emitter region toward the collector region by providing, in the base region, several spaced apart quantum size regions of different thicknesses, with the thicknesses of the quantum size regions being graded from thickest near the collector to thinnest near the emitter.

18 Claims, 29 Drawing Sheets

U.S. PATENT DOCUMENTS

| | | | | |
|---|---|---|---|---|
| 5,780,880 | A | 7/1998 | Enquist | 257/197 |
| 5,796,714 | A | 8/1998 | Chino et al. | 372/50 |
| 5,936,258 | A * | 8/1999 | Imamura et al. | 257/21 |
| 6,337,494 | B1 | 1/2002 | Ryum et al. | 257/197 |
| 6,479,844 | B2 | 11/2002 | Taylor | 257/192 |
| 6,573,527 | B1 * | 6/2003 | Sugiyama et al. | 257/14 |
| 6,720,589 | B1 * | 4/2004 | Shields | 257/194 |
| 6,737,684 | B1 | 5/2004 | Takagi et al. | 257/194 |
| 2002/0030195 | A1 | 3/2002 | Yoshii et al. | 257/101 |

OTHER PUBLICATIONS

Chun-Xia Du, Farice Duteil, Goran Hansson, and Wei-Xin Ni, "Si/SiGe/Si: Er: O Light-Emitting Transistors Prepared By Differential Molecular-Beam Epitaxy", App. Phys. Letts., vol. 78, No. 12, Mar. 19, 2001.

J. Hu et al., "Type II Photoluminescence And Conduction Band Offsets of GaAsSb/InGaAs and GaAsSb/InP Heterostructures Grown By Metalorganic Vapor Phase Epitaxy" Applied Physics Letters, 73(19) Nov. 1998.

Y. Yamashita et al., "Pseudomorphic $In_{0.52}Al_{0.48}As/In_{0.7}Ga_{0.3}As$ HEMTs With an Ultrahigh $f_T$ of 562 GHz", IEEE Electron Device Lett. 23 (10), 573-575 (2002).

P. Grossman, and J. Choma, Jr., "Large Signal Modeling of HBT's Including Self-Heating and Transit Time Effects" IEEE Transactons On Microwave Theory And Techniques, vol. 40, No. 3, Mar. 1992.

Y. Mori, J. Shibata, Y. Sasai, H. Serizawa, and T. Kajiwara, "Operation Principle Of The InGaAsP/InP Laser Transistor", Appl. Phys. Lett. 47(7), Oct. 1, 1985.

J. Genoe, C. Van Hoof, K. Fobelets, R. Mertens, and G. Borghs, "pnp Resonant Tunneling Light Emitting Transistor" Appl. Phys. Lett. 62 (9), Aug. 31, 1992.

P. Berger, N. Chand, and N. Dutta, "An AlGaAs Double-Heterojunction Bipolar Transistor Grown By Molecular-Beam Epitaxy", Appl. Phys. Lett. 59 (9), Aug. 26, 1991.

E. Zanoni, L. Vendrame, and P. Pavan, "Hot-Electron Electroluminescence in AlGaAs/GaAs Heterojunction Bipolar Transistors", Appl. Phys. Lett. 62 (4), Jan. 25, 1993.

M. Harris, B. Wagner, S. Halpern and M. Dobbs, "Full Two-Dimensional Electroluminescent (EL) Analysis of GaAs/AlGaAs HBTs", IEEE 99CH36296. $37^{th}$ Annual International Reliability Physics Symposium, San Diego., California, 1999.

K. Wang, P. Asbeck, M. Chang, G. Sullivan, and D. Millar, "Noninterfering Optical Method Of HBT Circuit Evaluation", Electronics Letters, vol. 25 No. 17, Aug. 17, 1989.

W. Shockley, "The Theory of p-n Junctions in Semiconductors and p-n Junction Transistors," Bell System Technology Journal 28, 435-489 (1949).

R.N. Hall, G.E. Fenner, J.D. Kingsley, T.J. Soltys, and R.O. Carlson, "Coherent Light Emission From GaAs Junctions," Phys. Rev. Lett., vol. 9. pp. 366-368, Nov. 1, 1962.

M.I. Nathan, W.P. Dumke, G. Burns, F.H. Dill, Jr., and G. Lasher, "Stimulated Emission of Radiation From GaAs p-n Junction," Appl. Phys. Lett., vol. 1, pp. 62-64. Nov. 1962.

N. Holonyak, Jr. and S.F. Bevacqua, "Coherent (Visible) Light Emission From $GaAs_{1-x}P_x$ Junctions," Appl. Phys. Lett., vol. 1, pp. 82-83, Dec. 1962.

T.M. Quist, R.H. Rediker, R.J. Keyes, W.E. Krag, B. Lax, A.L. McWhorter, and H.J. Zeiger, "Semiconductor Maser of GaAs," Appl. Phys. Lett., vol. 1. pp. 91-92, Nov. 1962.

H. Kroemer, "Theory Of A Wide-Gap Emitter for Transistors," Proceedings of the IRE 45, 1535-1537 (1957).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T+f_{MAX}$ Performance of InP/InGaAs Single Heterojunction Bipolar Transistors," Electronics Letters, May 2003.

W. Hafez, J.W. Lai, and M. Feng. "Sub-micron InP/InGaAs Single Heterojunction Bipolar Transistors With $f_T$ of 377 GHz," IEEE Electron Device Letters, May 2003.

W. Hafez, J.W. Lai and M. Feng, "Vertical scaling of 0.25 um Emitter InP/InGaAs Single Heterojunction Bipolar Transistors With $f_T$ of 452 GHz," IEEE Electron Devices Letters, Jul. 2003.

P. Enquist, A. Paolella, A.S. Morris, F.E. Reed, L. DeBarros, A.J. Tessmer, and J.A. Hutchby, "Performance Evaluation of Heterojunction Bipolar Transistors Designed for High Optical Gain", Research Triangle Institute, Research Triangle Park, NC, ARL, Research Laboratory, Ft. Monmouth, NJ, Applied Research and Technology, Wake Forest, NC, , IEEE, pp. 278-287, 1995.

Yukihiko Arai, Masaaki Sakuta, Hiroshi Takano, Takashi Usikubo, Ryozo Furukawa, and Masao Kobayashi, "Optical Devices From AlGaAs-GaAs HBTs Heavily Doped With Amphoteric Si", IEEE Transactoins On Electron Devices, pp. 632-638, Vo. 42. No. 4, Apr. 1995.

G.W. Taylor, R.S. Mand, J.G. Simmons, and A.Y. Cho, "Ledistor—A Three-Terminal Double Heterostructure Optoelectronic Switch", Appl. Phys. Lett. 50 (6), Feb. 9, 1987.

N. Holonyak "Quantum-Well and Superlattice Lasers: Fundamental Effects" pp. 1-18, in "The Physics Of Submicron Structures", Plenum Press, 1984.

V. Ryzhii, M. Willander, M. Ryzhii and I. Khmyrova, "Heterostructure Laser-Transistors Controlled by Resonant-Tunnelling Electron Extraction", Semicond. Sci. Technol. 12 (1997) 431-438.

V. Ryzhi and I. Khmyrova, "Bistability Effect In Laser-Transistor Resonant-Tunneling Structure" Solid-State Electronics vol. 37 Nos. 4-6 pp. 1259-1262, 1994.

R. Bhat, W.-P. Hong, C. Caneau, M. A. Koza, C.-K. Nguyen, and S. Goswami, "InP/GaAsSb/InP And InP/GaAsSb/InGaAsP Double Heterojunction Bipolar Transistors With A Carbon-Doped Base Grown By Organometallic Chemical Vapor Deposition" Appl. Phys. Lett. 68, 985 (1996).

T. McDermott, E. R. Gertner, S. Pittman, C. W. Seabury, and M. F. Chang, "Growth And Doping Of GaAsSb Via Metalorganic Chemical Vapor Deposition for InP Heterojunction Bipolar Transistors" Appl. Phys. Lett. 58, 1386 (1996).

Dvorak, C. R. Bolognesi, O. J. Pitts, and S. P. Watkins, "300 GHz InP/GaAsSb/InP Double HBTs With High Current Capability and $BV_{CEO} \geq 6$ V" IEEE Elec. Dev. Lett. 22, 361 (2001).

V. de Walle, "Band Lineups And Deformation Potentials In The Model-Solid Theory" Physical Review B 39, 1871 (1989).

M. Feng, N. Holonyak, Jr. and W. Hafez, "Light-Emitting Transistor: : Light Emission From InGaP/GaAs Heterojunction Bipolar Transistors", Appl. Phys. Lett. 84, 151, Jan. 5, 2004.

J. Shibata, Y. Mori, Y. Sasai, N. Hase, H. Serizawa, and T. Kahwara "Fundamental Characteristics Of An InGaAsP/InP Laser Transistor", Electronic Letters, vol. 21, pp. 98, 1985.

\* cited by examiner

SEMICONDUCTOR METHOD AND DEVICE

RELATED APPLICATION

This is a continuation-in-part of U.S. patent application Ser. No. 10/646,457, filed Aug. 22, 2003 now abandoned, and said Application is incorporated herein by reference. The subject matter of the present Application is related to subject matter of copending U.S. patent application Ser. No. 10/861,320, filed Jun. 4, 2004, and assigned to the same assignee as the present Application.

FIELD OF THE INVENTION

This invention relates to high speed semiconductor devices and methods, and also to semiconductor devices and methods for producing controlled light emission, and which are also simultaneously capable of electrical signal amplification.

BACKGROUND OF THE INVENTION

A part of the background hereof lies in the development of light emitters based on direct bandgap semiconductors such as III-V semiconductors. Such devices, including light emitting diodes and laser diodes, are in widespread commercial use.

Another part of the background hereof lies in the development of wide bandgap semiconductors to achieve high minority carrier injection efficiency in a device known as a heterojunction bipolar transistor (HBT), which was first proposed in 1948 (see e.g. U.S. Pat. No. 2,569,376; see also H. Kroemer, "Theory Of A Wide-Gap Emitter For Transistors" Proceedings Of The IRE, 45, 1535-1544 (1957)). These transistor devices are capable of operation at extremely high speeds. An InP HBT has recently been demonstrated to exhibit operation at a speed above 500 GHz.

It is among the objects of the present invention to provide bipolar transistor devices and methods which can operate at extremely high speeds, even potentially exceeding those already achieved. It is also among the objects of the present invention to provide devices and methods for producing controlled light emission, and to also provide devices capable of simultaneous control of optical and electrical outputs.

SUMMARY OF THE INVENTION

An aspect hereof involves a direct bandgap heterojunction transistor that exhibits light emission from the base layer. Modulation of the base current produces modulated light emission. [As used herein, "light" means optical radiation that can be within or outside the visible range.]

A further aspect hereof involves three port operation of a light emitting HBT. Both spontaneous light emission and electrical signal output are modulated by a signal applied to the base of the HBT.

In accordance with an aspect of the invention, a plurality of spaced apart quantum size regions (e.g. quantum wells and/or quantum dots) having different thicknesses are provided in the base region of a bipolar transistor and are used to advantageously promote carrier transport unidirectionally through the base region. As an example, the base region can be provided with several spaced apart quantum size regions of different thicknesses, with the thicknesses of the quantum size regions being graded from thickest near the collector to thinnest near the emitter. An injected electron is captured in a smaller well, tunnels into the next bigger well, and then the next bigger well, and so forth, until, at the biggest well closest to the collector, it tunnels to and relaxes to the lowest state of the biggest well and recombines. The arrangement of wells encourages carrier transport unidirectionally from emitter toward collector. Maximum recombination and light are derived from the biggest well as near as possible to the collector, which is an advantageous position, such as for optical cavity reasons. Carriers diffuse "downhill" in energy; i.e., toward the thicker wells. The asymmetry in well size provides improved directionality and speed of carrier transport. In embodiments as a light emitting HBT, light emission and device speed are both enhanced.

Further features and advantages of the invention will become more readily apparent from the following detailed description when taken in conjunction with the accompanying drawings.

DETAILED DESCRIPTION

Figure 1:
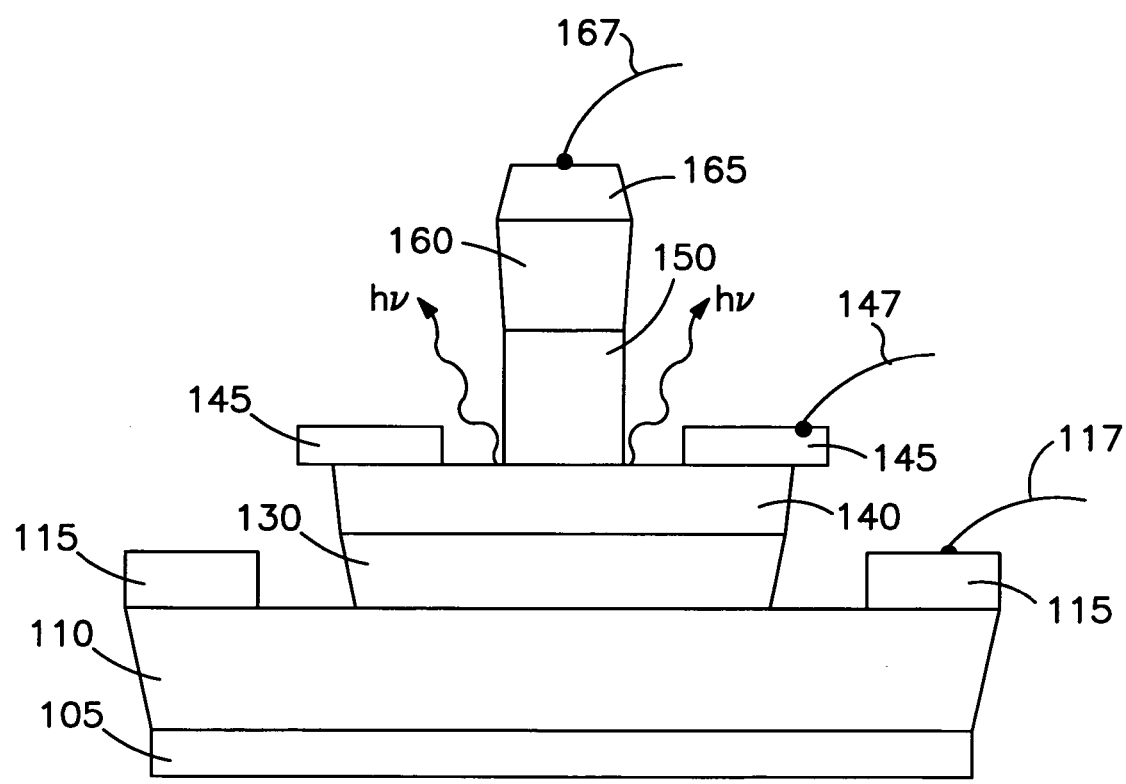
FIG. 1 is a simplified cross-sectional diagram, not to scale, of a device in accordance with an embodiment hereof, and which can be used in practicing an embodiment of the method of the invention.

FIG. 1 illustrates a device in accordance with an embodiment hereof and which can be used in practicing an embodiment of a method hereof. A substrate 105 is provided, and the following layers are disposed thereon: subcollector 110, collector 130, base 140, emitter 150, and cap layer 160. Also shown are collector metallization (or electrode) 115, base metallization 145, and emitter metallization 165. Collector lead 117, base lead 147, and emitter lead 167 are also shown. In a form of this embodiment, the layers are grown by MOCVD, and the collector layer 130 comprises 3000 Angstrom thick n-type GaAs, n=2×10$^{16}$ cm$^{-3}$, the base layer 140 comprises 600 Angstrom thick p+ carbon-doped compositionally graded InGaAs (1.4% In), p=4.5×10$^{19}$ cm$^3$, the emitter layer 150 comprises 800 Angstrom thick n-type InGaP, n=5×10$^{17}$ cm$^{-3}$, and the cap layer comprises 1000 Angstrom thick n+ InGaAs, n=3×10$^{19}$ cm$^{-3}$.

This embodiment employs a fabrication process sequence which includes e-beam defined Ti/Pt/Au emitter contacts (165), a self-aligned emitter etch, a self-aligned Ti/Pt/Au base metal deposition, a base-collector etch, and collector metal deposition. A bisbenzocyclobutene (BCB) based etch-back process is employed for "backend" fabrication (i.e., to render the electrode and contact formation on the top of the transistor).

For conventional PN junction diode operation, the recombination process is based on both an electron injected from the n-side and a hole injected from the p-side, which in a bimolecular recombination process can be limited in speed. In the case of HBT light emission hereof, the base "hole" concentration is so high that when an electron is injected into the base, it recombines (bimolecular) rapidly. The base current merely re-supplies holes via relaxation to neutralize charge imbalance. For a heterojunction bipolar transistor (HBT), the base current can be classified into seven components, namely: (1) hole injection into the emitter region ($i_{Bp}$); (2) surface recombination current in the exposed extrinsic base region ($i_{Bsurf}$); (3) base ohmic contact recombination current ($i_{Bcont}$); (4) space charge recombination current ($i_{Bscr}$); (5) bulk base non-radiative recombination current due to the Hall-Shockley-Reed process (HSR) ($i_{BHSR}$); (6) bulk base Auger recombination current ($i_{BAug}$); and (7) bulk base radiative recombination current ($i_{Brad}$).

For a relatively efficient HBT with ledge passivation on any exposed base region, the surface recombination current can be reduced significantly. Hence, the base current and recombination lifetime can be approximated as primarily bulk HSR recombination, the Auger process, and radiative recombination. The base current expressed in the following equation (1) is then related to excess minority carriers, Δn, in the neutral base region, the emitter area, $A_E$, the charge, q, and the base recombination lifetime, $\tau_n$ as $$i_B = i_{BHSR} + i_{BAUG} + i_{Brad} = qA_E\Delta n/\tau_n \quad (1)$$

The overall base recombination lifetime, $\tau_n$, is related to the separate recombination components of Hall-Shockley-Read, $\tau_{HSR}$, Auger, $\tau_{AUG}$, and radiative recombination, $\tau_{rad}$, as $$\tau_n = (1/\tau_{HSR} + 1/\tau_{AUG} + 1/\tau_{rad})^{-1} \quad (2)$$

The light emission intensity ΔI in the base is proportional to $i_{Brad}$ and is related to the minority carrier electron with the majority hole over the intrinsic carrier concentration, (np−$n_i^2$), in the neutral base region and the rate of radiative recombination process, B, set forth in Equation (3) below, where the hole concentration can be approximated as equal to base dopant concentration, $N_B$. The radiative base current expressed in equation (3) is then related to excess minority carriers, Δn, in the neutral base region, and the base recombination lifetime, $\tau_{rad}$ as $$i_{Brad} = qA_EB(np-n_i^2) = qA_EBnp = qA_E\Delta n(BN_B) = qA_E\Delta n/\tau_{rad} \quad (3)$$

For a high speed HBT, it is easy to predict that the base recombination lifetime can be less than half of the total response delay time. Hence, the optical recombination process in the base should be at least two times faster than the speed of the HBT. In other words, HBT speed, which can be extremely fast, is limiting.

Figure 2:
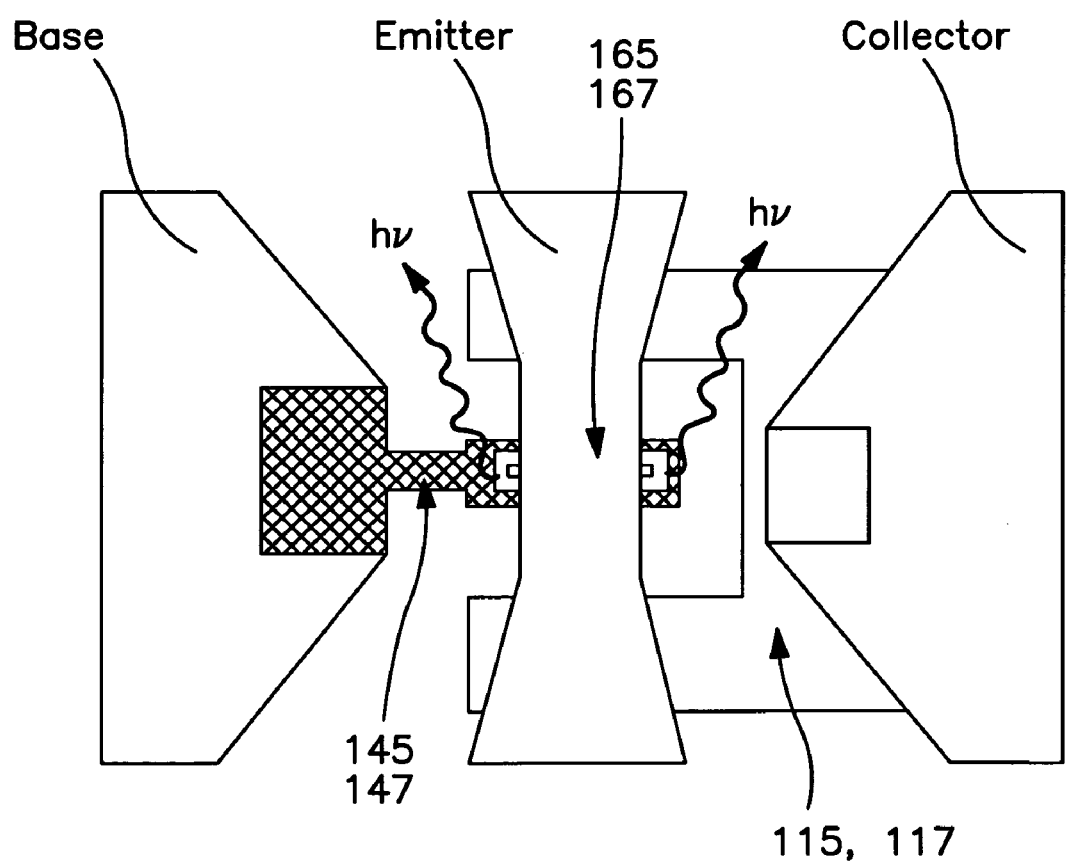
FIG. 2 is a top view of the FIG. 1 device layout for an embodiment hereof.
Figure 3:
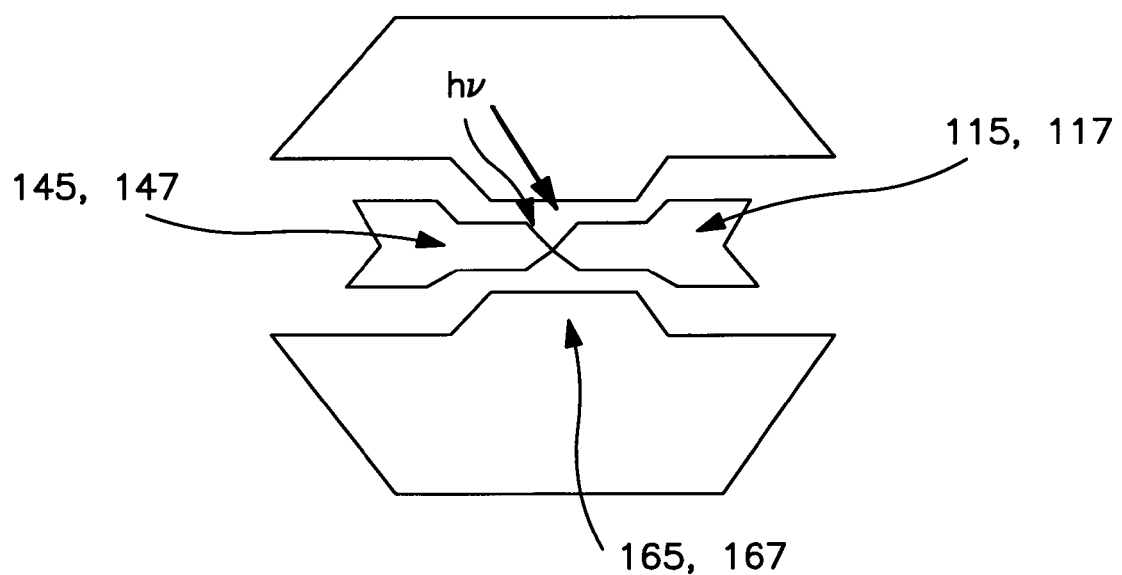
FIG. 3 is CCD microscopic view of a test device in accordance with an embodiment hereof.

FIG. 2 shows the top view of the device layout and FIG. 3 shows a silicon CCD microscopic view of a fabricated 1×16 µm² HBT test device with light emission (white spots) from the base layer under normal operation of the transistor.

Figure 4:
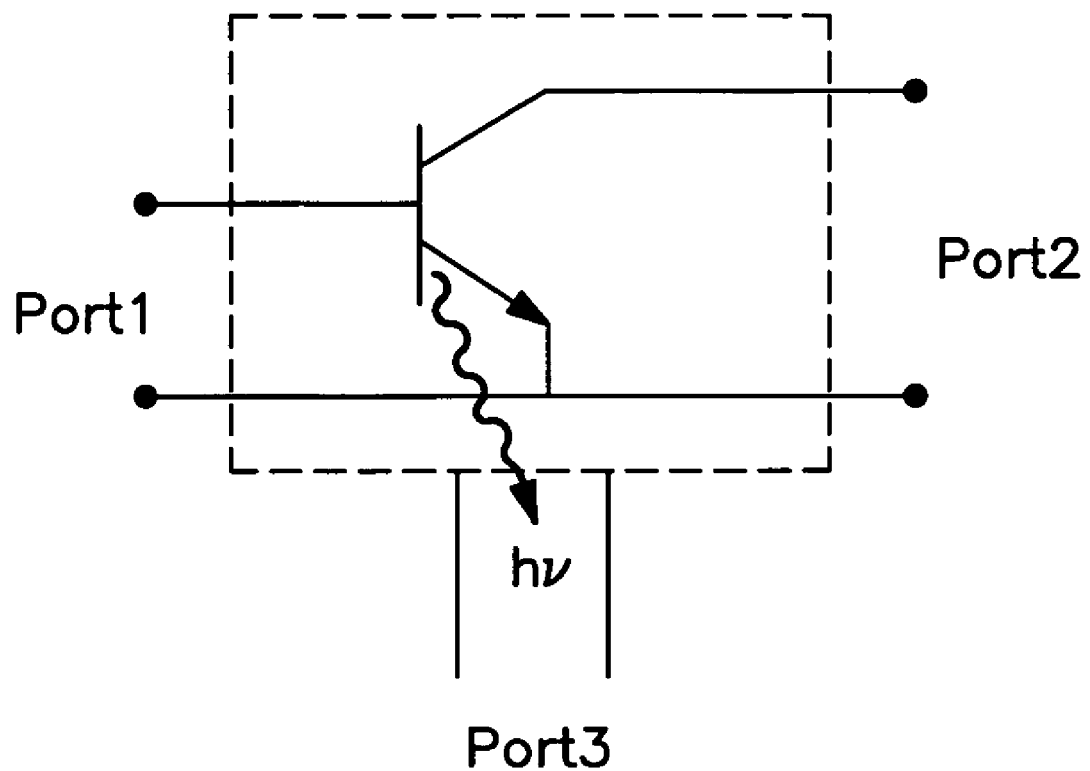
FIG. 4 is a simplified schematic diagram of a three port device in accordance with an embodiment hereof.

In typical transistor operation, one of the three terminals of a transistor is common to both the input and output circuits. This leads to familiar configurations known as common emitter (CE), common base (CB), and common collector (CC). The common terminal (often ground reference) can be paired with one or the other of the two remaining terminals. Each pair is called a port, and two pairs for any configurations are called a two-port network. The two ports are usually identified as an input port and as an output port. In accordance with a feature hereof as illustrated in FIG. 4, a third port, namely an optical output port, is provided, and is based on (recombination-radiation) emission from the base layer of the HBT light emitter in accordance with an embodiment of the invention. For the HBT of FIG. 1 operated, for example, with a common emitter configuration (see FIG. 4) when an electrical signal is applied to the input port (Port 1), there results simultaneously an electrical output with signal amplification at Port 2 and optical output with signal modulation of light emission at Port 3.

Figure 5:
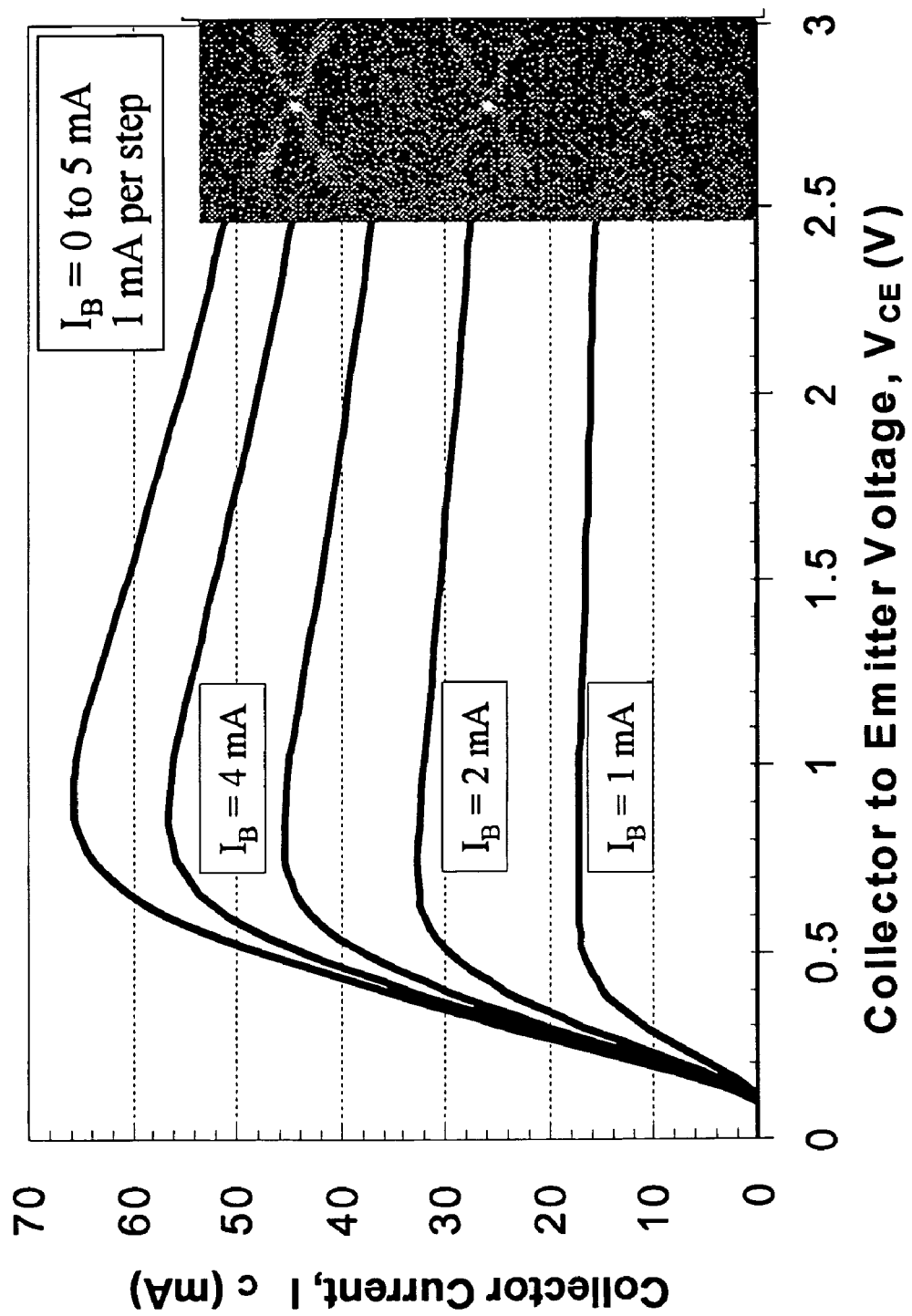
FIG. 5 is a graph of the common emitter output characteristics of the test device, also showing the observed light emission.

The common emitter output characteristics of the test version of the FIG. 1, 2 device are shown in FIG. 5. The DC beta gain $\beta=17$ at $i_b=1$ mA. For $i_b=0$ mA ($i_c=0$ mA), no light emission is observed using a silicon CCD detector. For $i_b=1$ mA ($i_c=17.3$ mA), weak light emission is observed from the base layer. For $i_b=2$ mA ($i_c=33$ mA), stronger light emission is observed, and still stronger for $i_b=4$ mA ($i_c=57$ mA). The spontaneous light emission because of radiative recombination in the base of the HBT in transistor operation is evident.

Figure 6A:
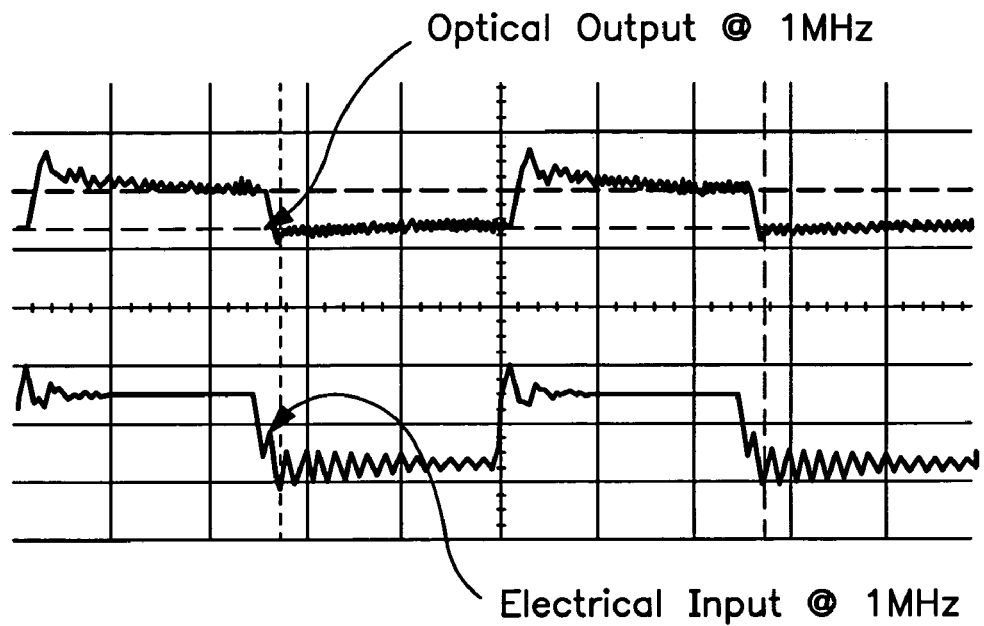
FIG. 6, which includes oscilloscope traces 6A and 6B, shows, respectively, the input reference and output modulated light waveforms for the test device.
Figure 6B:
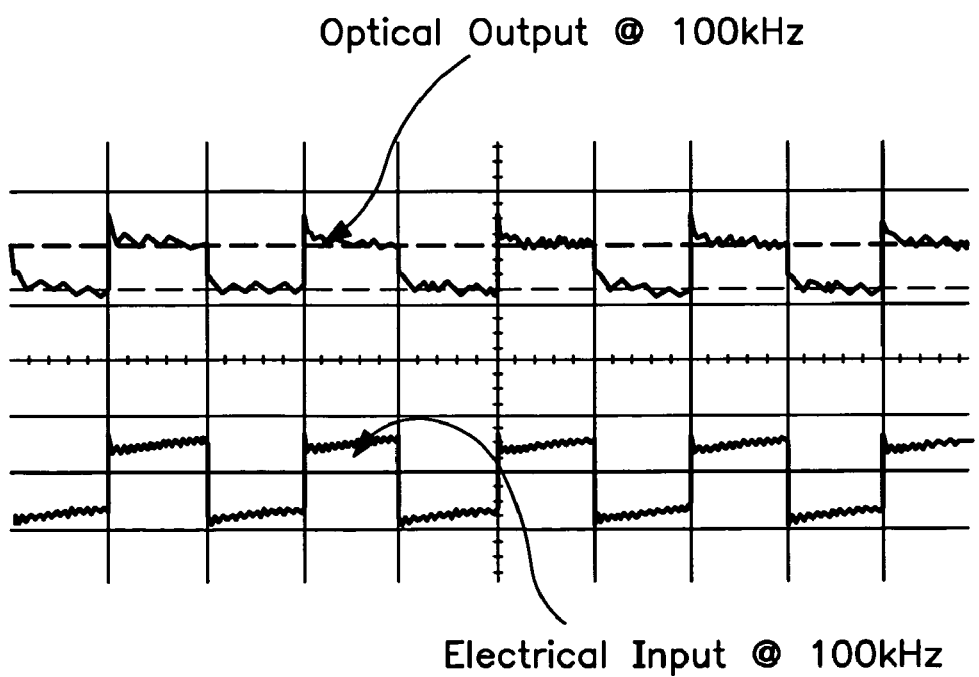

An output light modulation test was performed for this embodiment. A pattern generator (Tektronix Function Generator) produces an AC signal with peak-to-peak amplitude of 1 V. A bias tee combines this AC signal with a DC bias voltage of 1.1V from a DC supply. The InGaP/GaAs HBT turn-on voltage is $V_{BE}=1.5$V. The HBT transistor's emission area (open space of the base region) is less than 1-µm×2-µm. The light from the small aperture (most of the HBT light is obscured in this test) is coupled into a multimode fiber probe with a core diameter of 25 µm. The light is fed into a Si APD detector with a 20-dB linear amplifier. A sampling oscilloscope displays both the input modulation signal and the output light signal. The optical emission wavelength is around 885 nm due to the compositionally graded InGaAs base (1.4% In). FIG. 6 shows the input (lower trace) reference and output (upper trace) light waveforms when the HBT is modulated at 1 MHz (FIG. 6A) and also at 100 KHz (FIG. 6B). The output signal has a peak-to-peak amplitude of 375 µV at 1 MHz and 400 µV at 100 KHz. These data show that the output light signal tracks the input signal, showing clearly that the HBT is a light-emitting transistor (LET) that operates at transistor speed.

Figure 7:
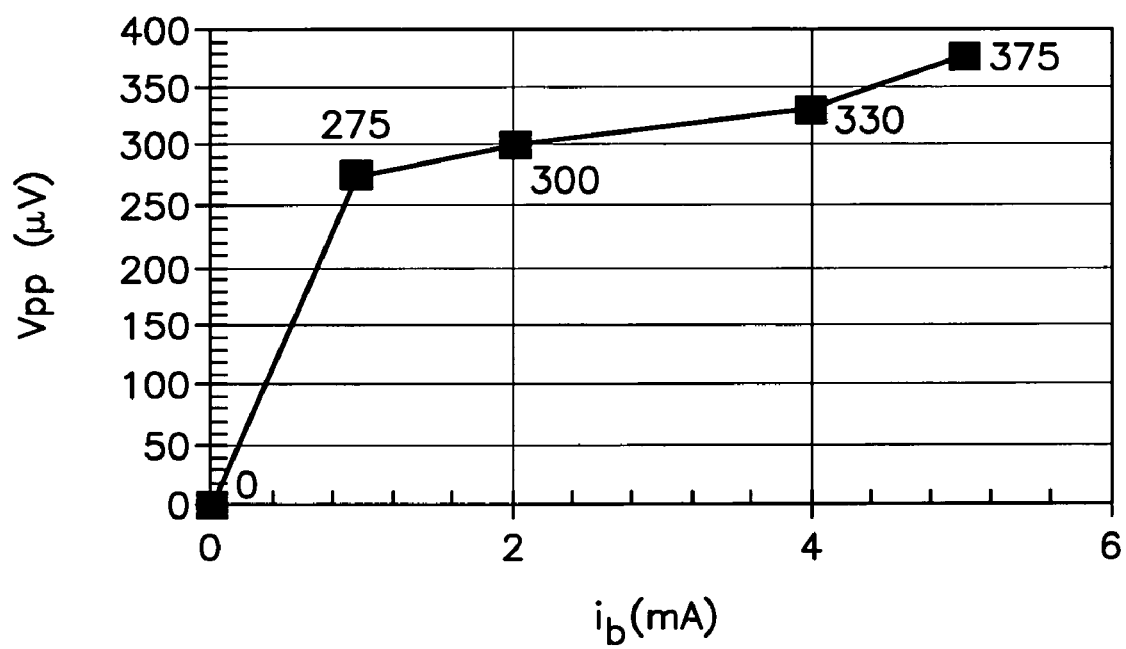
FIG. 7 is a graph showing light output as a function of base current for the test device.

The output peak-to-peak amplitude, $V_{pp}$, which is directly proportional to the light emission intensity, $\Delta I_{out}$, as a function of base current, is shown in FIG. 7. The nonlinear behavior may be due to beta compression because of heating and the fact that the device geometry has not yet been optimized for light emission (as well as lateral biasing effects). Nevertheless, these measurements, i.e., $\Delta I_{out}$ (light intensity) vs. $\Delta i_b$ ($i_b=0$ to 5 mA), demonstrate the HBT as a three terminal controllable light source.

It will be understood that other configurations and material systems can be used, including, as examples, GaAs and GaN based HBTs, or other direct bandgap material systems.

Figure 8:
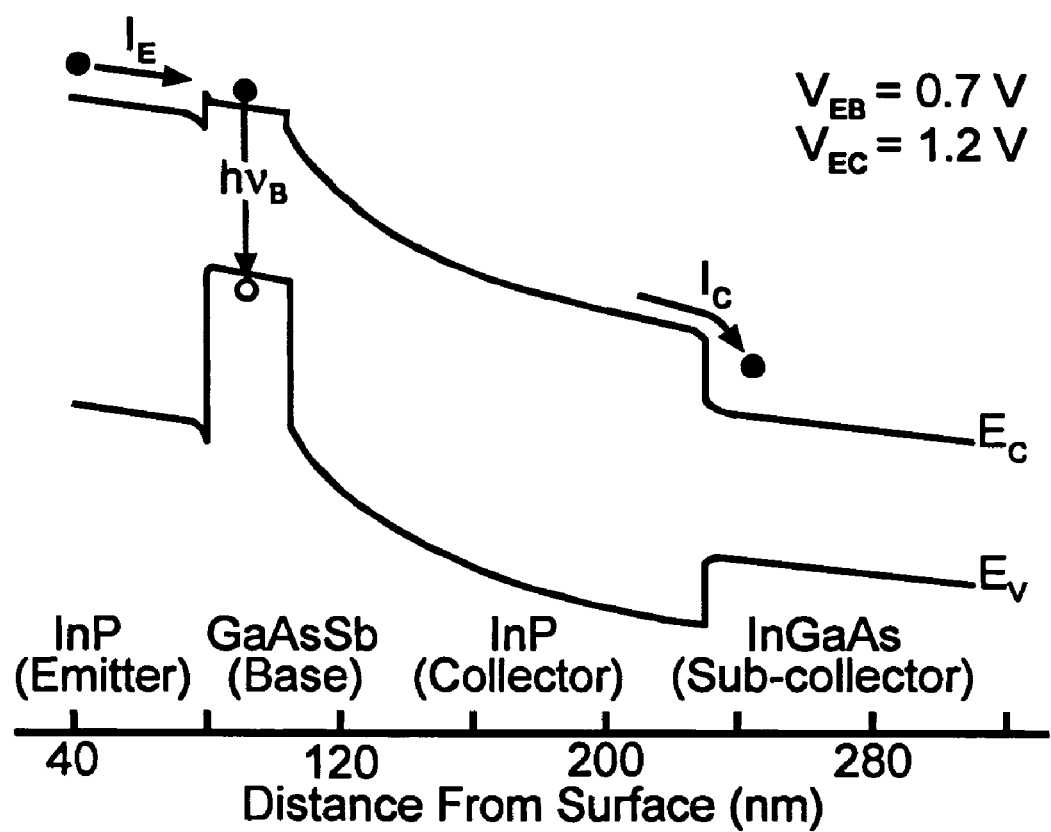
FIG. 8 is a diagram and band diagram of a Type II InP/GaAsSb/InP double heterojunction bipolar transistor (DHBT), a light emitting transistor (LET), with a 30 nm p-type GaAsSb base generating a recombination-radiation signal in normal transistor operation (collector in reverse bias).

GaAsSb has been proposed as an alternative to InGaAs for the base of InP HBTs due to a more favorable Type-II bandgap line-up (hole confined, electron not) at the base-collector (or emitter) junction (as can be seen in FIG. 8 below). Since Type-II InP-based HBTs have a larger valence band discontinuity (as can be seen in FIG. 8 below), there is superior hole blocking at the emitter (see R. Bhat, W.-P. Hong, C. Caneau, M. A. Koza, C.-K. Nguyen, and S. Goswami, Appl. Phys. Lett. 68, 985 (1995); . T. McDermott, E. R. Gertner, S. Pittman, C. W. Seabury, and M. F. Chang, Appl. Phys. Lett. 58, 1386 (1996). Due to an all-InP collector, Type-II InP/GaAsSb DHBTs (double HBTs) are expected to have better thermal properties and a higher breakdown voltage than Type-I InP/InGaAs DHBTs. InP/GaAsSb DHBTs have been reported to achieve cutoff frequencies above 300 GHz (see Dvorak, C. R. Bolognesi, O. J. Pitts, and S. P. Watkins, IEEE Elec. Dev. Lett. 22, 361 (2001). FIG. 8 shows a band diagram of a Type II InP/GaAsSb/InP double heterojunction bipolar transistor (DHBT), the physical structure and operation of which can be similar to that of FIGS. 1-4 above. In this example, the light-emitting transistor has a 30 nm p-type GaAsSb base generating a recombination-radiation signal in normal transistor operation (collector in reverse bias).

The Type II InP/GaAsSb DHBT is fabricated with 120× 120 µm² emitter area and current gain $\beta=38$. Under normal transistor bias, optical emission is obtained with wavelength centered at $\lambda_{peak}=1600$ nm from a 30 nm $GaAs_{0.51}Sb_{0.49}$ base region doped with carbon to 4e19 cm$^{-3}$. In this example there is demonstrated three-port operation of the Type II HBLET with simultaneously an amplified electrical output and an optical output with signal modulation at 10 kHz (limited by the bandwidth of a germanium PIN detector).

The layer structure for the present example is grown by MOCVD on a semi-insulating, Fe-doped InP substrate. The HBLET includes: a 150 nm InP collector, Si-doped to 3×e16 cm$^{-3}$; a 30 nm $GaAs_{0.51}Sb_{0.49}$ base, C-doped to 4e19 cm$^{-3}$; a 20 nm InP emitter, Si-doped to 5×10$^{17}$ cm$^{-3}$; and a 40 nm $In_{0.53}Ga_{0.47}As$ emitter contact cap, n=2×10$^{19}$ cm$^{-3}$. The DHBT device is fabricated using a standard mesa process. The energy band diagram, as shown in FIG. 8, of the Type-II light emitting InP (n)/GaAsSb (p+)/InP (n) double heterojunction bipolar transistor (DHBT), was computed using the Model Solid Theory (V. de Walle, Physical Review B 39, 1871 (1989)). The energy gap for the $GaAs_{0.51}Sb_{0.49}$ base layer is 0.72 eV with a conduction band discontinuity $\Delta E_c=0.15$ eV and a valence band discontinuity $\Delta E_v=0.57$ eV between the InP collector (or emitter) and GaAsSb base. The energy band diagram in FIG. 8 indicates the DHBT is in the common-emitter (C-E) configuration in normal transistor mode operation with the emitter-base junction forward biased at $V_{eb}=0.7$V and the emitter-collector junction reversed biased at $V_{ec}=1.2$V.

Figure 9:
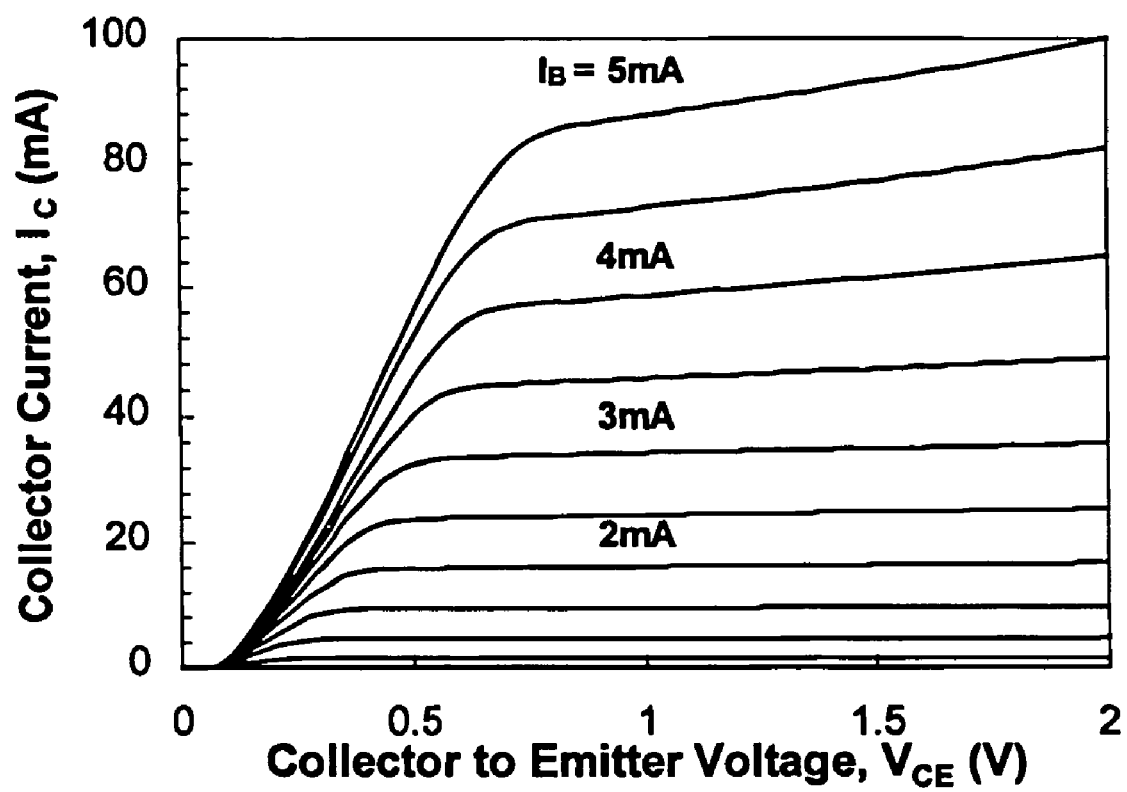
FIG. 9 shows the common emitter output characteristics, collector current vs. collector-to-emitter voltage (I-V curve), of the Type-II transistor of FIG. 8 (emitter area 120×120 μm$^2$).

The common emitter output characteristics, collector current vs. collector emitter voltage (I-V) curve, of the described Type-II transistor with a 120×120 µm² emitter area is shown in FIG. 9. The dc beta gain ($\beta=\Delta i_c/\Delta i_b$) is $\beta=5$ at $i_b=1$ mA, increasing to $\beta=16$ at $i_b=3$ mA, and to $\beta=38$ at $i_b=5$ mA. From the measured Gummel plot of the transistor, the ideality factor for lower base currents is around 1.9 indicating a considerable number of traps in the base-emitter space charge region (SCR). The ideality factor for higher base currents is 1.3, indicating more surface recombination once the SCR traps are filled. For a smaller 30×30 µm² emitter DHBT, the dc beta gain ($\beta=\Delta i_c/\Delta i_b$) is $\beta=25$ (larger) at $i_b=1$ mA since the number of SCR traps are proportional to the emitter area of the DHBT. For a 120×120 µm² HBT, the current gain cutoff frequency, $f_t$ is measured at 800 MHz. The power gain cutoff frequency, $f_{max}$, is 300 MHz. For the same layer structure with a smaller emitter of 0.8×8 μm², the HBT cutoff frequencies are $f_t$=181 GHz and $f_{max}$=152 GHz.

The base current owing to surface recombination is relatively small for a Type II DHBT of such a large emitter area as 120×120 μm². Hence, the base current can be approximated as primarily non-radiative Hall-Shockley-Read (HSR) recombination in the emitter-base space charge region and radiative recombination in the base neutral region. For the radiative process in the base region of an HBT, the light emission intensity ΔI is proportional to the component of base current supplying radiative recombination, $i_{Brad}$, which is proportional to the excess (injected) minority carriers, Δn, in the neutral base region, the charge, q, the emitter area, $A_E$, and inversely proportional to the radiative recombination lifetime, $\tau_{rad}$. For common-emitter (C E) Type-II DHBT light emission, the base hole concentration is so high that an electron injected into the base, recombines rapidly (bi-molecularly). The base current merely re-supplies holes via relaxation to neutralize charge imbalance.

Figure 10:
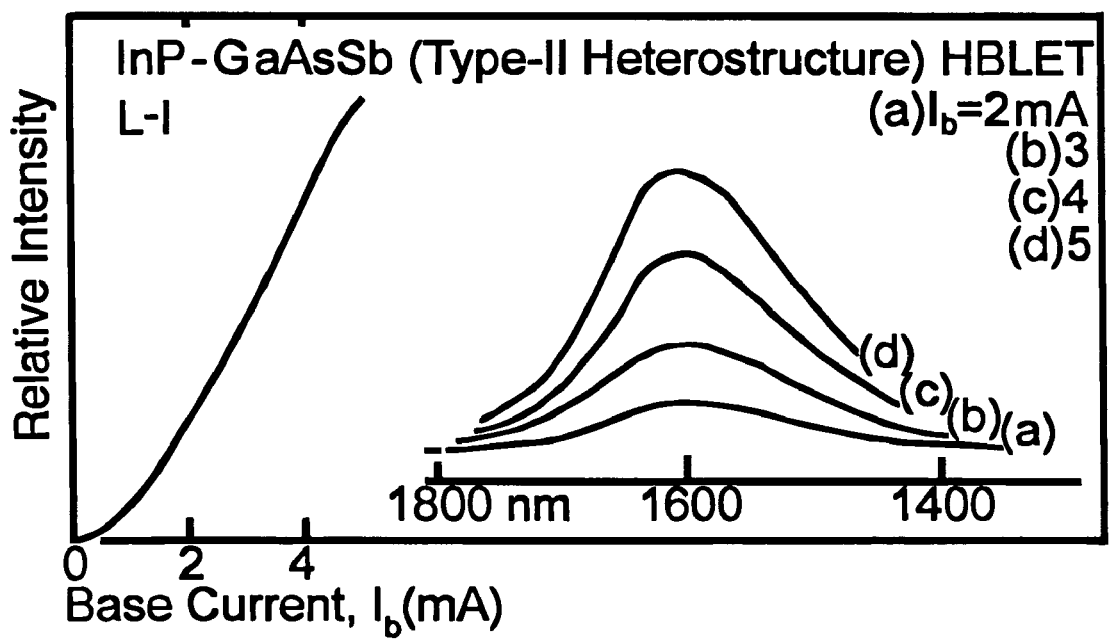
FIG. 10 is a graph of optical emission intensity (recombination radiation) of the Type-II DHBT of FIG. 8 as a function of base current, with an L-I characteristic demonstrating nearly linear behavior. The inset shows the wavelength of the recombination radiation from the p-type GaAsSb base at various base currents.

To detect the HBLET light emission, an ultra-sensitive germanium PIN detector (Edinburgh Instruments Ltd., Model E1-L) with a very high responsivity of 5×10⁹ V/W was used. FIG. 10 shows the nearly linear relationship of optical emission intensity (recombination radiation) as a function of base current. The light emission wavelength of the device operating as an HBT is centered near $\lambda_{peak}$=1600 nm, agreeing with the band-to-band recombination transition of $GaAs_xSb_{1-x}$. The shift in peak light emission towards shorter wavelength from the gap ($E_g$=0.72 eV, $\lambda_{peak}$=1722 nm) of lattice-matched ($GaAs_{0.51}Sb_{0.49}$) can be attributed to the alloy not matching the InP lattice constant. The broadened light emission extends from 1450 to 1750 nm owing mainly to the alloy scattering of the GaAsSb base layer.

Figure 11:
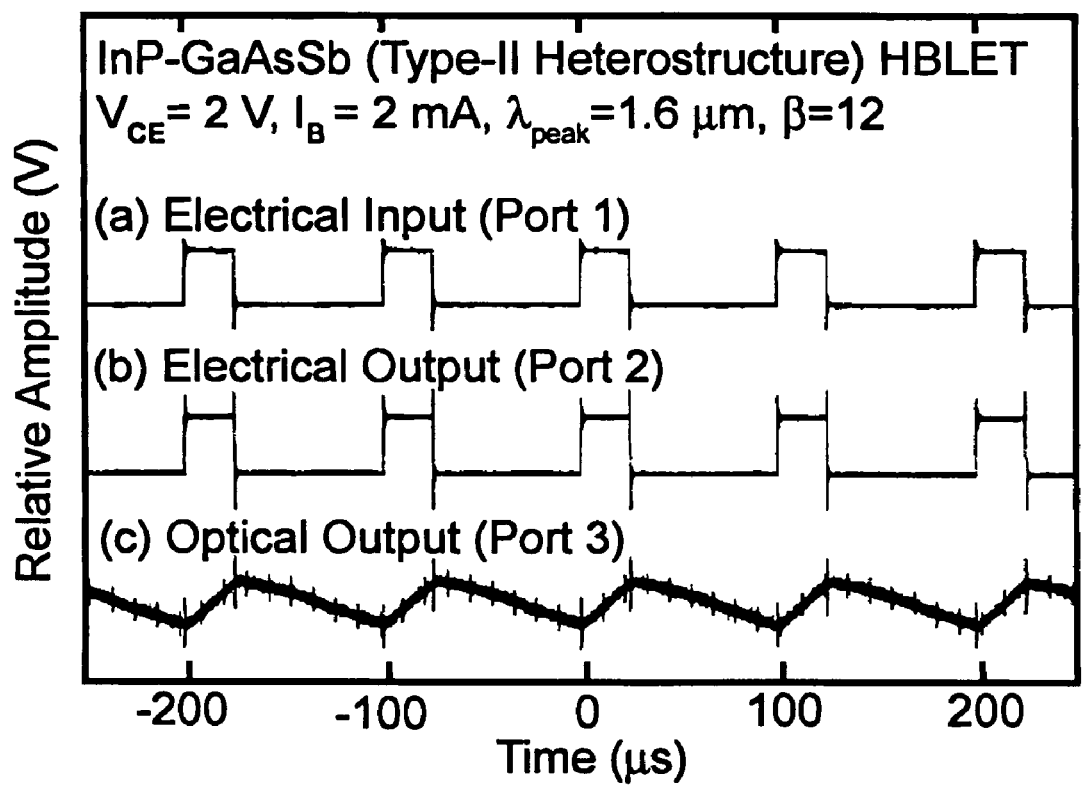
FIG. 11 illustrates three-port operation of the Type-II DHBT of FIG. 8 biased in the common emitter configuration: (a) a 10 kHz input signal (upper trace, port 1), (b) amplified output signal (middle trace, port 2), and (c) optical output modulated at 10 kHz (lowest trace, port 3).

A pattern generator producing an AC input signal at 10 kHz was used for a test of light output modulation. The 120×120 μm² DHBT recombination radiation was fed into a germanium PIN detector integrated with a JFET pre-amplifier. The combination has a very high responsivity of 5×10⁹ V/W but slow time response of 1 to 2 ms, of course, limiting the measurement (10 kHz). FIG. 11 shows traces from a four channel sampling oscilloscope and illustrates three port operation. The top trace (a) is the input signal (at port 1) modulated at 10 kHz and the second trace (b) is the output voltage (at port 2) with the DHBT biased (common emitter) at $I_B$=2 mA and $V_{CE}$=2 V. The third trace (c) shows the output optical signal modulated at 10 kHz (at port 3). These data illustrate the three-port operation of a Type-II DHBT, with a GaAsSb alloy base region, biased in the common-emitter configuration.

Figure 12:
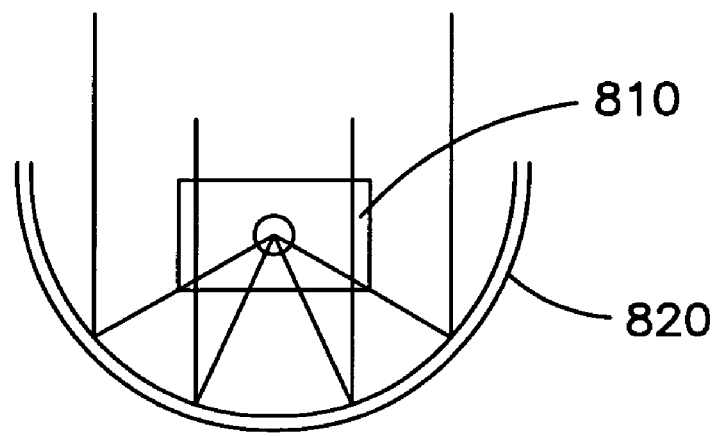
FIG. 12 illustrates an embodiment hereof that includes a light reflector.

FIG. 12 illustrates use of the three terminal light emitting HBT 810 in conjunction with a reflector cup 820 for enhancing light collection and directionality.

Figure 13:
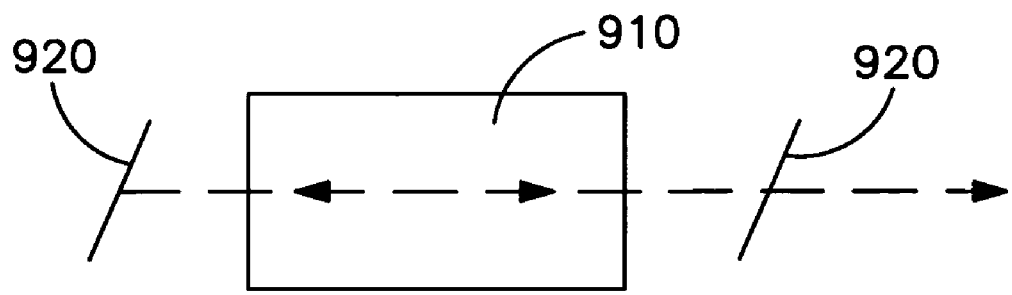
FIG. 13 illustrates a laser device in accordance with an embodiment hereof.

FIG. 13 illustrates the three terminal light emitting HBT, 910, in a lateral cavity, represented at 920, for operation as a lateral gain guided laser. The lateral cavity may be defined, for example, by cleaved edges on or near the light emitting region.

An aspect hereof involves employing stimulated emission to advantage in the base layer of a bipolar transistor (e.g. a bipolar junction transistor (BJT) or a heterojunction bipolar transistor (HBT), in order to enhance the speed of the transistor. Spontaneous emission recombination lifetime is a fundamental limitation of bipolar transistor speed. In a form hereof, the base layer of a bipolar transistor is adapted to enhance stimulated emission (or stimulated recombination) to the detriment of spontaneous emission, thereby reducing recombination lifetime and increasing transistor speed. In a form of this aspect hereof, at least one layer exhibiting quantum size effects, preferably a quantum well or a layer of quantum dots, preferably undoped or lightly doped, is provided in the base layer of a bipolar transistor. Preferably, at least a portion of the base layer containing the at least one layer exhibiting quantum size effects, is highly doped, and of a wider bandgap material than said at least one layer. The at least one quantum well, or layer of quantum dots, within the higher gap highly doped material, enhances stimulated recombination and reduces radiative recombination lifetime. A two-dimensional electron gas ("2-DEG") enhances carrier concentration in the quantum well or quantum dot layer, thereby improving mobility in the base region. Improvement in base resistance permits reduction in base thickness, with attendant reduction of base transport time. These advantages in speed are applicable in high speed bipolar transistors in which light emission is utilized, and/or in high speed bipolar transistors in which light emission is not utilized. In light emitting bipolar transistor devices, for example heterojunction bipolar transistors of direct bandgap materials, the use of one or more layers exhibiting quantum size effects can also be advantageous in enhancing light emission and customizing the emission wavelength characteristics of the devices. In some embodiments, doped or highly doped quantum size regions are also utilized.

Figure 14A:
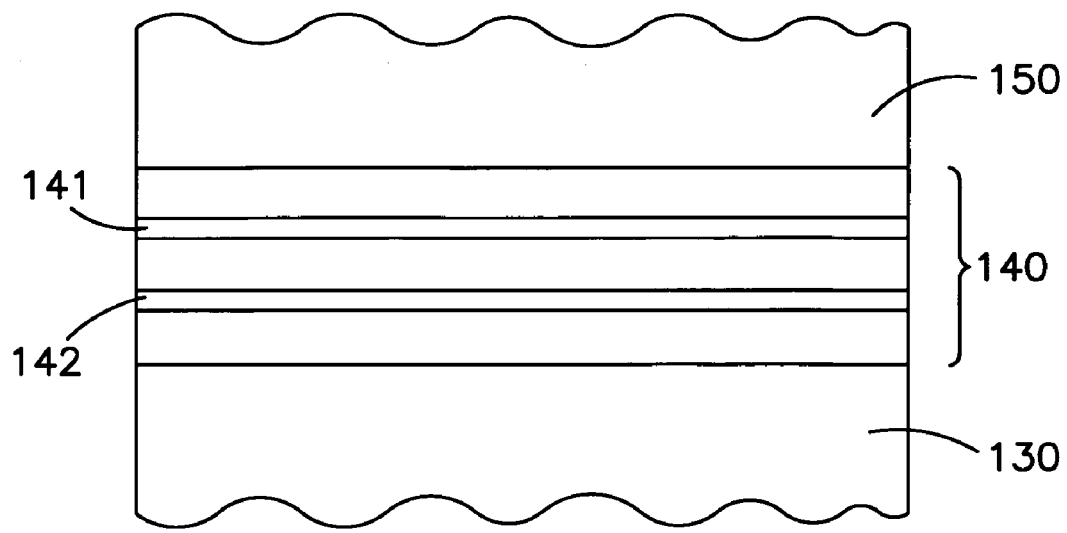
FIG. 14A shows a portion of a device in accordance with an embodiment hereof, employing one or more quantum wells.

FIG. 14A shows the use of one or more quantum wells, 141, 142, in the base region 140 of the FIG. 1 device (or other embodiments), these quantum wells being operative to enhance the recombination process for improved device speed, modulation characteristics, and/or to tailor the spectral characteristics of the device. In one preferred embodiment of this form hereof, the quantum well(s) (and/or dots—see below) are of lower bandgap than the surrounding base layer (140) material and are undoped or lightly doped (e.g. below about $10^{16}$ cm⁻³). The surrounding base layer (140) material is highly doped (e.g. uniformly or delta doped to at least about $10^{18}$ cm⁻³ for p-type or at least about $10^{17}$ cm⁻³ for n-type). In one preferred embodiment, the quantum well (or dot) layer(s) have a thickness not greater than about 100 Angstroms.

As shown elsewhere herein, a cavity with reflectors can be utilized laterally (e.g. FIG. 13) or vertically (e.g. FIGS. 27 and 28) to obtain controlled laser operation of a light emitting HBT. As described above, enhancing stimulated emission can reduce recombination lifetime, to increase speed of operation. If desired, the reflectors (e.g. reflectors 920 of FIG. 13, or reflective layers in FIGS. 27 and 28) can be made completely reflective (instead of partially reflective, as in the case of the righthand reflector 920 of FIG. 13), which would eliminate output radiation through a reflector and maximize the reflective radiation available for enhancing stimulated emission.

Figure 14B:
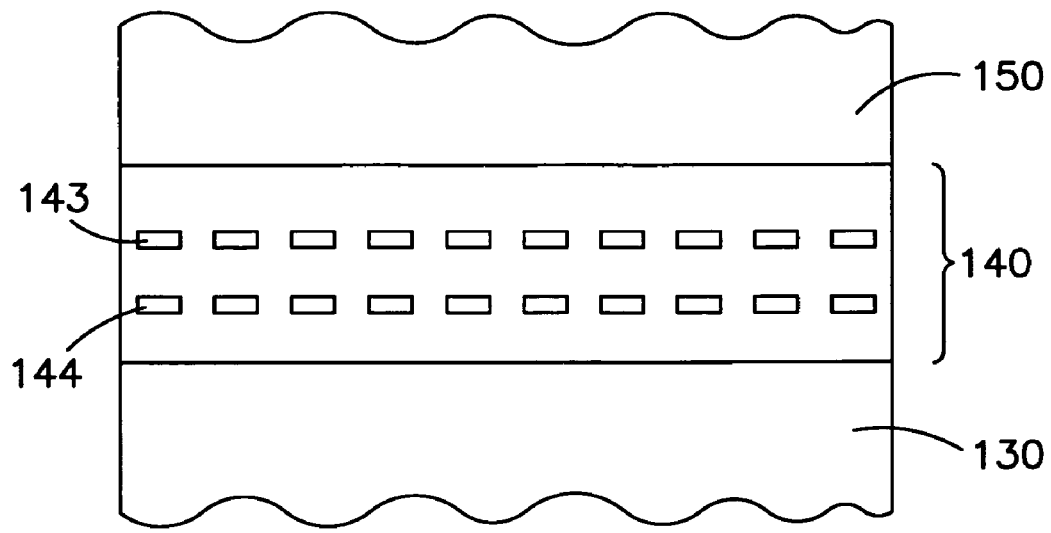
FIG. 14B shows a portion of a device in accordance with an embodiment hereof, employing one or more regions of quantum dots.

FIG. 14B shows use of one or more regions of quantum dots, 143, 144, in the base region 140 of the FIG. 1 device (or other embodiments), these quantum dot regions being operative to enhance the recombination process for improved device speed, modulation characteristics, and/or to tailor the spectral characteristics of the device.

Figure 15:
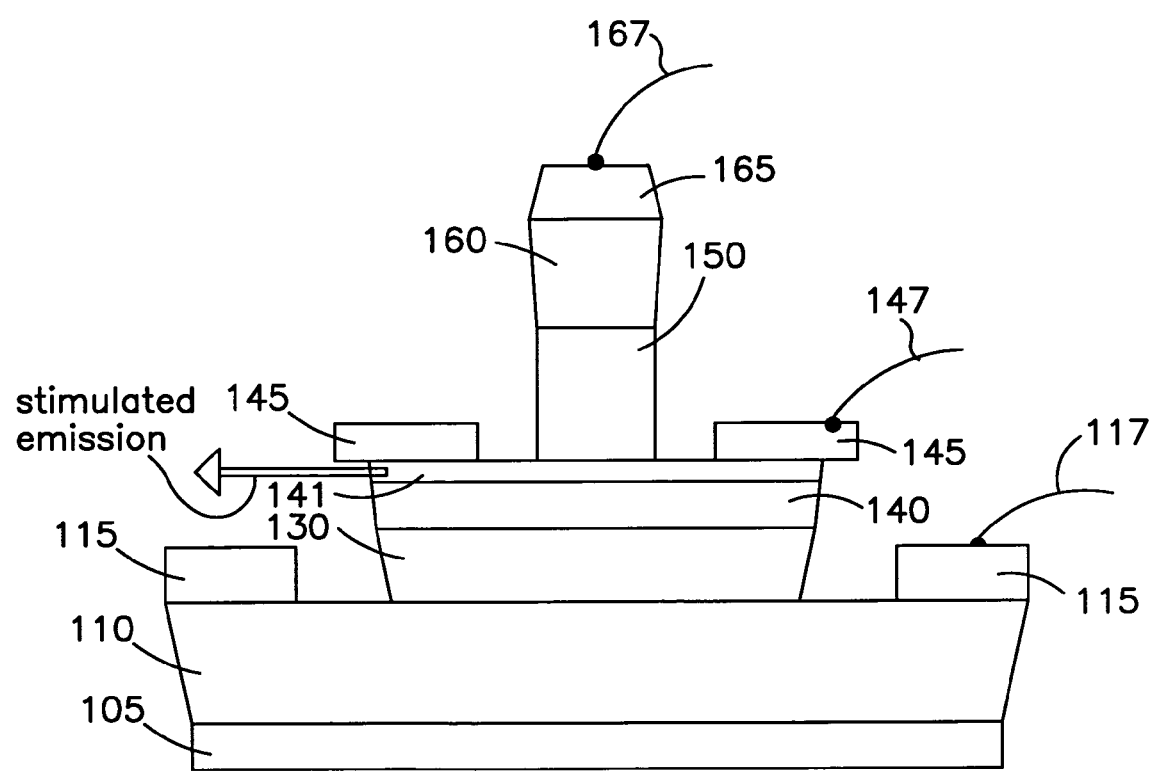
FIG. 15 is a simplified cross-sectional diagram, not to scale, of a device in accordance with an embodiment hereof, and which can be used in practicing an embodiment of a method hereof.

Examples of structures and material systems with a lightly doped or undoped quantum well(s) in a highly doped p+ base are shown in FIGS. 15-22. In FIG. 15, regions and metallizations having like reference numerals to those of FIG. 1 correspond generally in structure except for region 141 which is a quantum well layer. An example of Type I InP double heterojunction bipolar transistor (DHBT) has the following elements:

105: semi-insulating InP substrate;
110: n+ InGaAs sub-collector;

115: collector metallization;
130: n– InP collector;
140: p+ InP base;
141: undoped InGaAs QW in base;
147: base metallization;
150: n InP emitter;
160: n+ InGaAs emitter cap;
165: emitter metallization.

Figure 16:
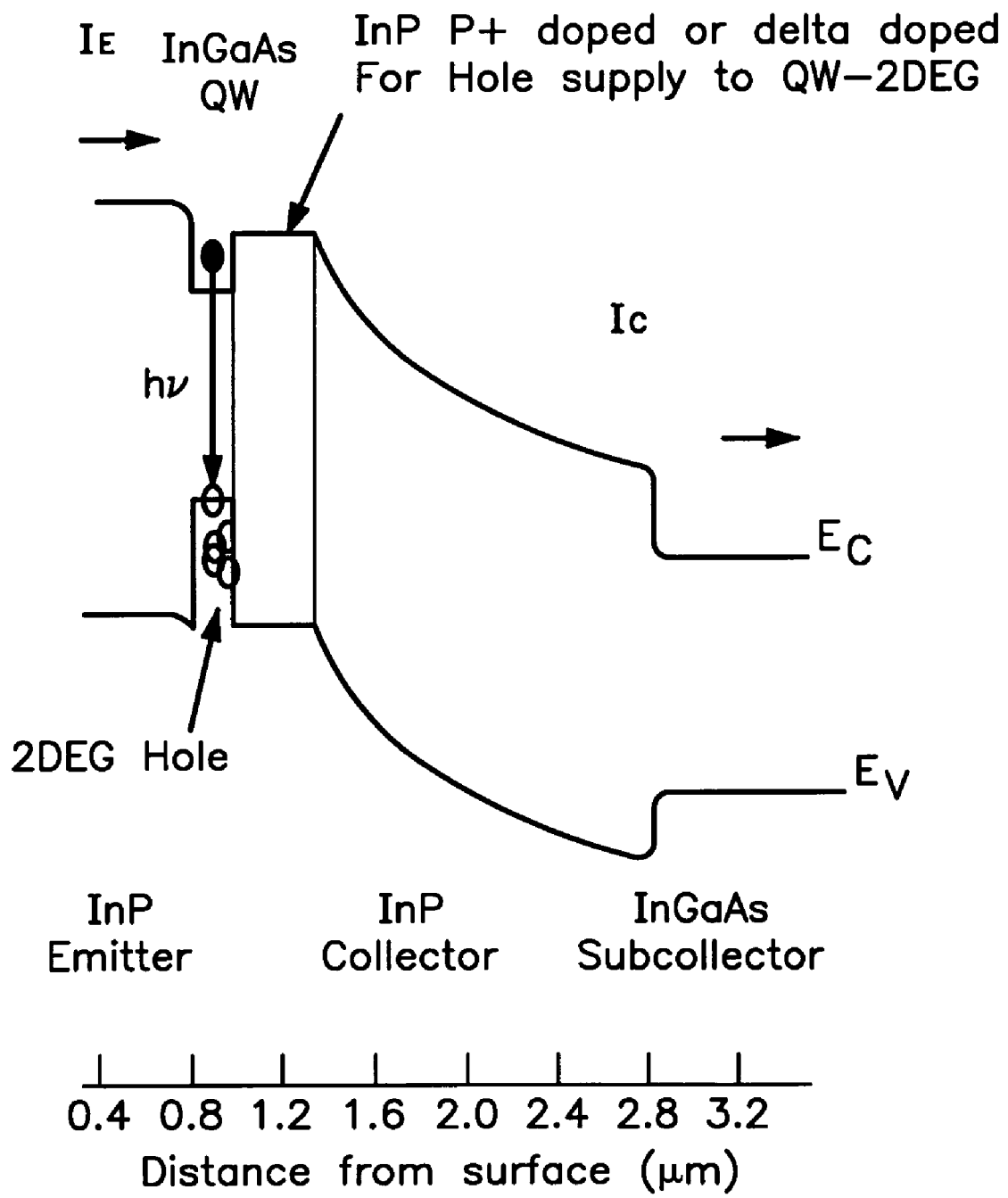
FIG. 16 is an energy band diagram for an example of the device of FIG. 15.

The band diagram for an example of this structure, biased at $V_{BE}=0.7V$ and $V_{BC}=0.5V$, is shown in FIG. 16. An example of a variation on this Type I structure (DHBT or SHBT) includes the following elements:
130: n InGaAsP collector;
140: p+ InGaAsP base;
141: undoped InGaAs QW in base;
150: n InP emitter.

An example of a Type II InP DHBT has the following elements:
105: semi-insulating InP substrate;
110: n+ InGaAs sub-collector;
115: collector metallization;
130: n– InP collector;
140: p+ InP base;
141: undoped GaAsSb QW in base;
147: base metallization;
150: n InP emitter;
160: n+ InGaAs emitter cap;
165: emitter metallization.

Figure 17:
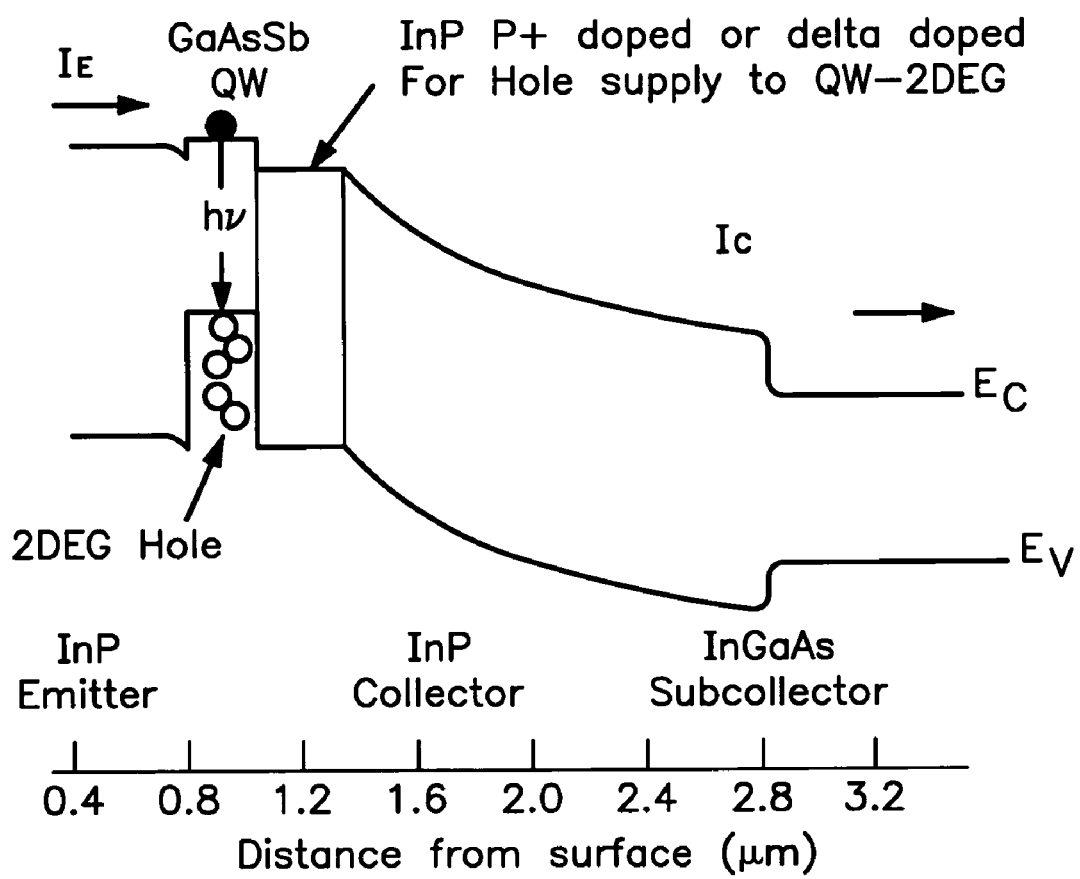
FIG. 17 is an energy band diagram for an example of another device in accordance with an embodiment hereof.

The band diagram for an example of this structure, biased at $V_{BE}=0.7V$ and $V_{BC}=0.5V$, is shown in FIG. 17. An example of a variation on this Type II structure (DHBT or SHBT) includes the following elements:
130: n InP collector;
140: p+ GaAsSb base;
141: undoped InGaAs QW in base;
150: n InP emitter.

Figure 18:
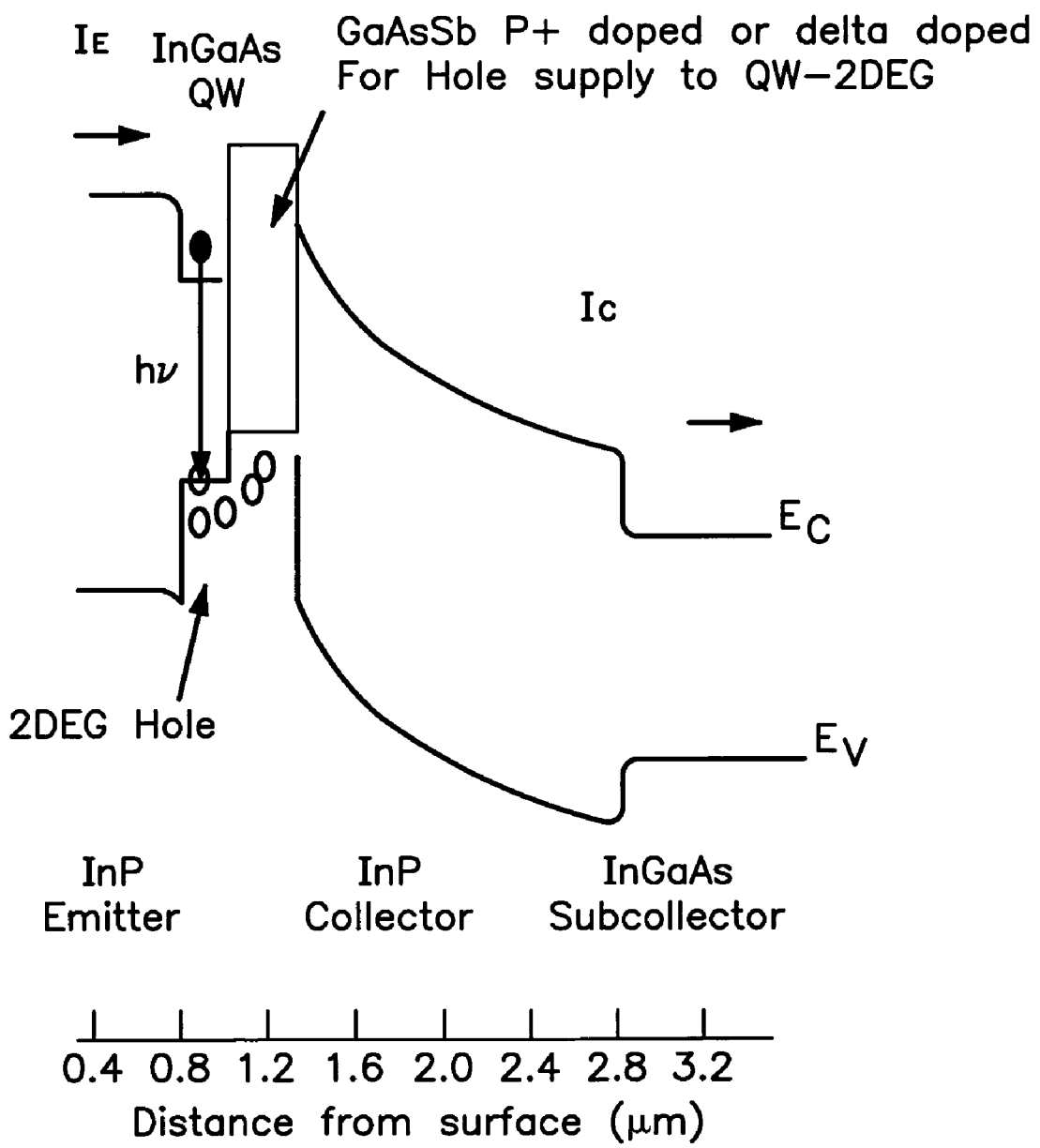
FIG. 18 is an energy band diagram for an example of a further device in accordance with an embodiment hereof.

The band diagram for an example of this structure, biased at $V_{BE}=0.7V$ and $V_{BC}=0.5V$, is shown in FIG. 18.

Examples of Type I GaAs SHBT or DHBT include the following elements:
130: n GaAs collector;
140: p+ GaAs base;
141: undoped InGaAs QW in base;
150: InGaP emitter or 130: N GaAs collector;
140: p+ GaAs base;
141: undoped InGaAs QW in base;
150: AlGaAs emitter.

Other material systems, for example devices based on GaN, can also be used.

Figure 19:
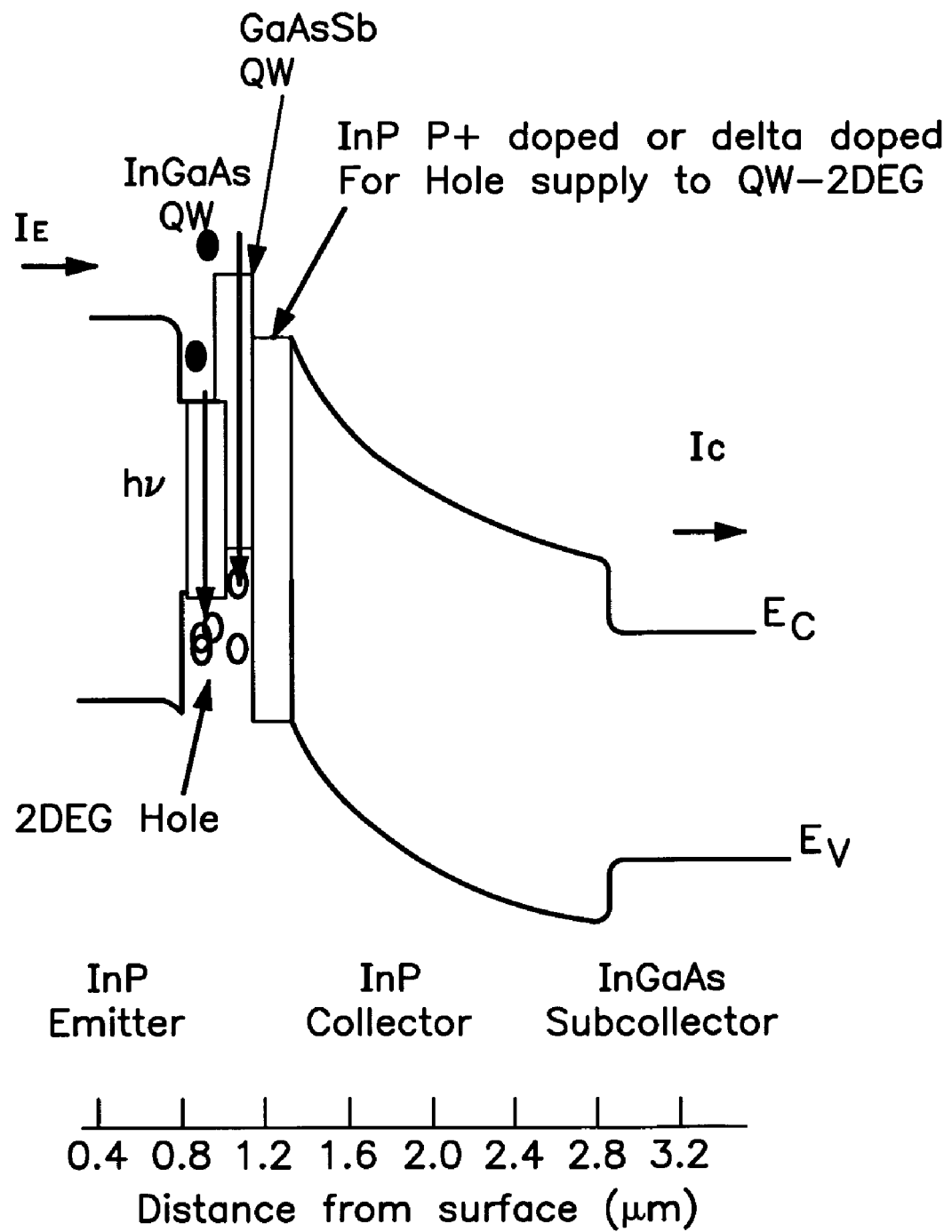
FIGS. 19-21 are energy band and structure diagrams for further devices with pluralities of quantum wells, in accordance with embodiments hereof.
Figure 20:
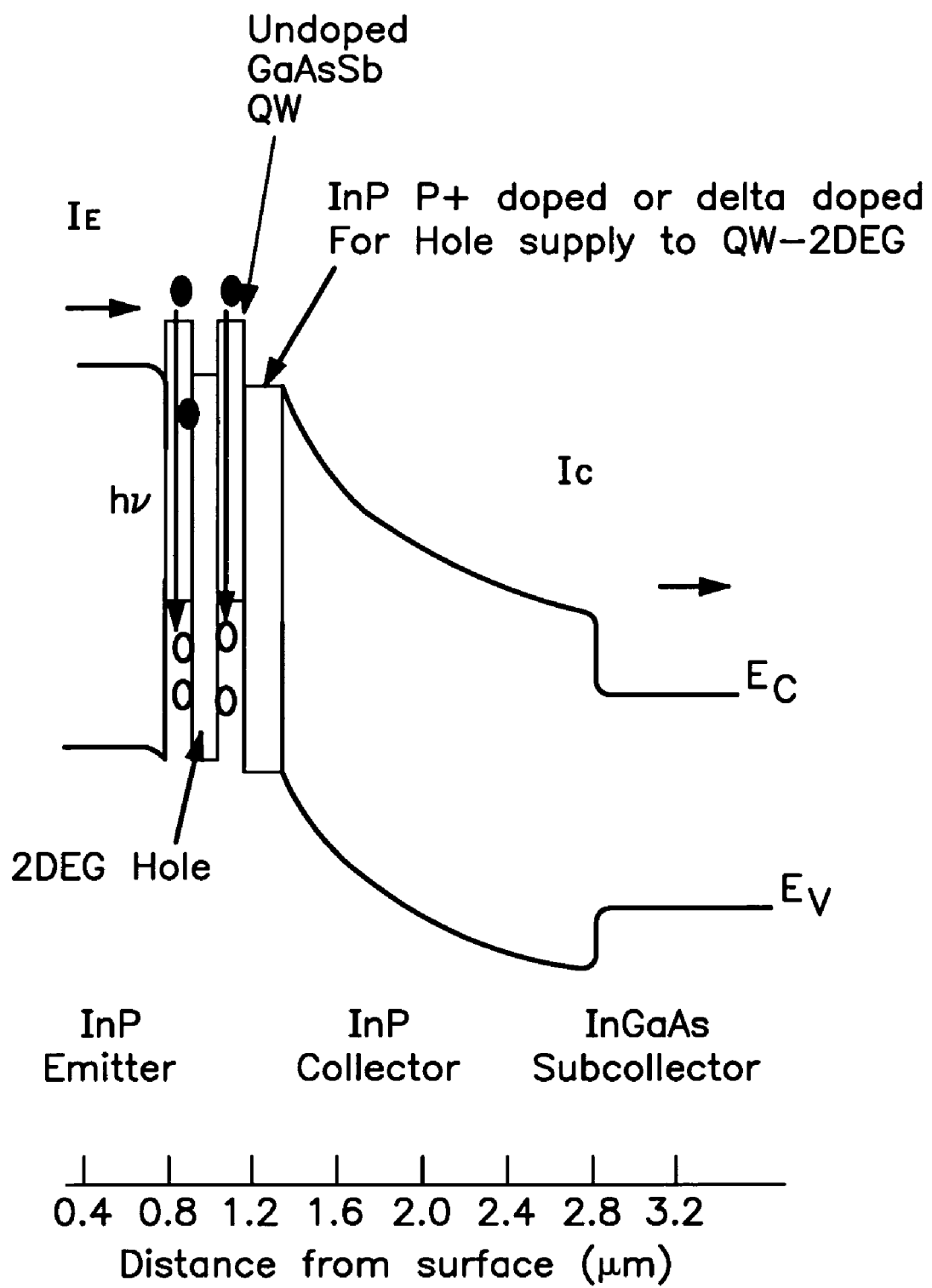
Figure 21:
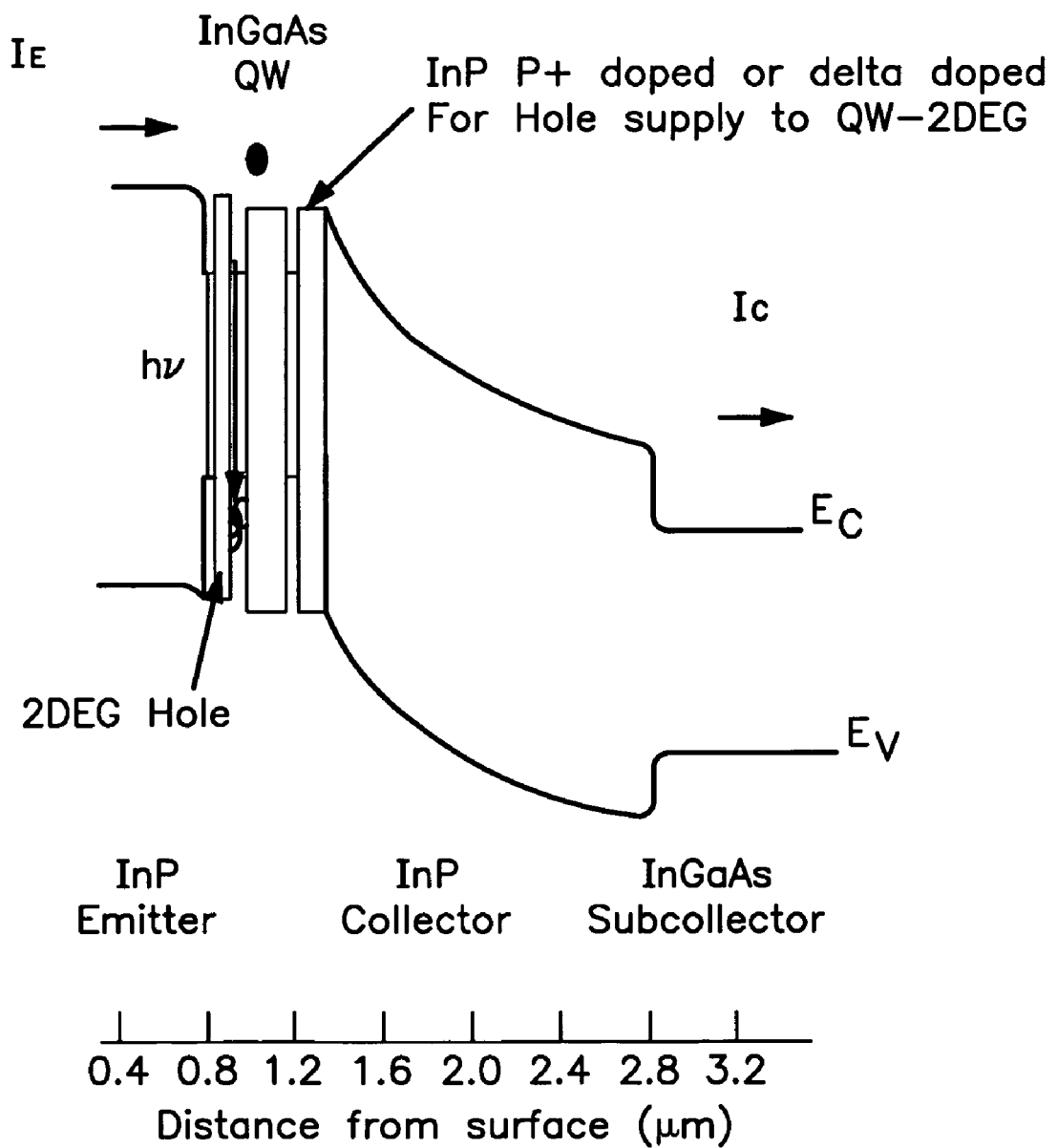

FIGS. 19, 20, and 21 show further band diagrams for HBTs quantum wells in the base.

FIG. 19 shows the structure and band diagram for an HBT with InP emitter and collector and an InGaAs subcollector. The base region comprises heavily doped (p+) GaAsSb that includes an undoped GaAsSb quantum well (which enhances recombination of holes) and a p+ InGaAs quantum well (which enhances recombination of electrons).

FIG. 20 shows the structure and band diagram for an HBT, again with InP emitter and collector and an InGaAs subcollector. The base region comprises heavily doped (p+) GaAsSb that includes two undoped GaAsSb quantum wells and two p+ InGaAs quantum wells. In FIG. 21 (which again has the same structure, other than the base), the base region includes three p+ InP quantum wells, with two intervening undoped InGaAs quantum wells. In addition to different well compositions, different well sizes can be employed.

As has been described, one or more quantum wells can be employed to advantage in the base region of an HBT. The example to follow shows GHz operation (although, for idealized conditions, it is expected that terahertz operation can be approached) of a light emitting transistor with two thin $In_{1-x}Ga_xAs$ (x=85%) quantum wells (QWs) acting as electron traps, hence serving as a QW-collector recombination radiation source imbedded in the GaAs base layer of an InGaP/GaAs HBT. Enhanced light emission is demonstrated.

Figure 22:
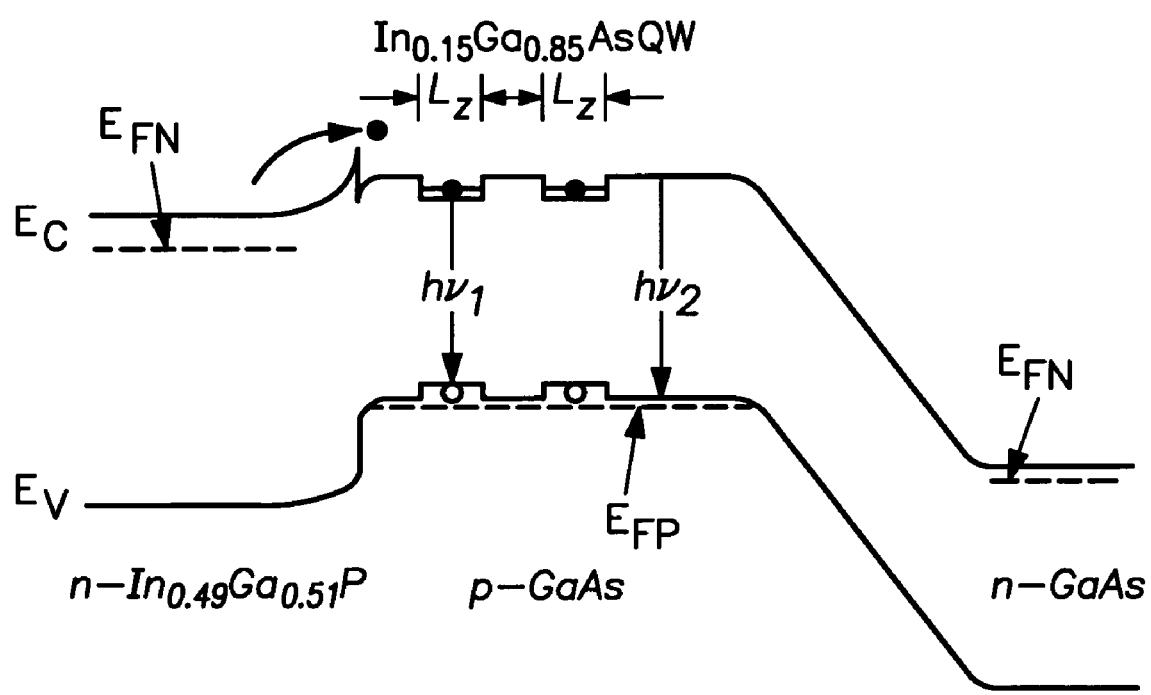
FIG. 22 is a diagram and band diagram of a quantum well (QW) InGaP/GaAs heterojunction bipolar transistor (QW HBT), a light emitting transistor (LET), with two 50 Å InGaAs QWs imbedded in the p-type GaAs base to aid electron capture and enhance the recombination radiation.

The band diagram of a light emitting transistor, an InGaP (n)/GaAs (p+)/GaAs (n) single heterojunction bipolar transistor (SHBT), with two thin InGaAs quantum wells in the heavily doped base, is shown in FIG. 22, and the layer structure will be evident from the diagram and the descriptions above and to follow. The base-emitter junction is forward biased and the base-collector junction is reversed biased in the common-emitter configuration in normal transistor mode operation. Light emission from the base at two different wavelengths is expected for band-to-band recombination transitions involving both the GaAs base and the InGaAs QWs. The layer structure for the device of this example was grown by MBE and includes: a 600 Å GaAs collector, n=2×$10^{16}$ cm$^{-3}$; two 50 Å $In_{1-x}Ga_xAs$ (x=85%) quantum wells (QWs) imbedded in a 300 Å carbon doped GaAs base, p=4×$10^{19}$ cm$^{-3}$; a 300 Å InGaP emitter, n=5×$10^{17}$ cm$^{-3}$; a 300 Å GaAs emitter cap, and a 300 Å InGaAs emitter contact cap, n=3×$10^{19}$ cm$^{-3}$. Below the collector a small 9-period 621-Å $Al_{0.2}Ga_{0.8}As$+725-Å $Al_{0.95}Ga_{0.15}As$ distributed Bragg reflector was included to aid vertical escape of the recombination radiation.

For common-emitter (C-E) HBT light emission, the base hole concentration is so high that when an electron is injected into the base, it recombines rapidly (bimolecularly). The base current merely re-supplies holes via relaxation to neutralize charge imbalance. The base current owing to surface recombination is relatively small for a 45 µm-diameter HBT. Hence, the base current can be approximated as primarily bulk Hall-Shockley-Read (HSR) recombination, the Auger process, and radiative recombination. For the radiative process in the base region of an HBT, the light emission intensity $\Delta I$ is proportional to the component of base current supplying radiative recombination, $i_{Brad}$, which is proportional to the excess minority carriers, $\Delta n$, in the neutral base region, the charge, q, the emitter area, $A_E$, and inversely proportional to the radiative recombination lifetime, $\tau_{rad}$. (M. Feng, N. Holonyak, Jr. and W. Hafez, Appl. Phys. Lett. 84, 151, 5 Jan. 2004.)

Figure 23A:
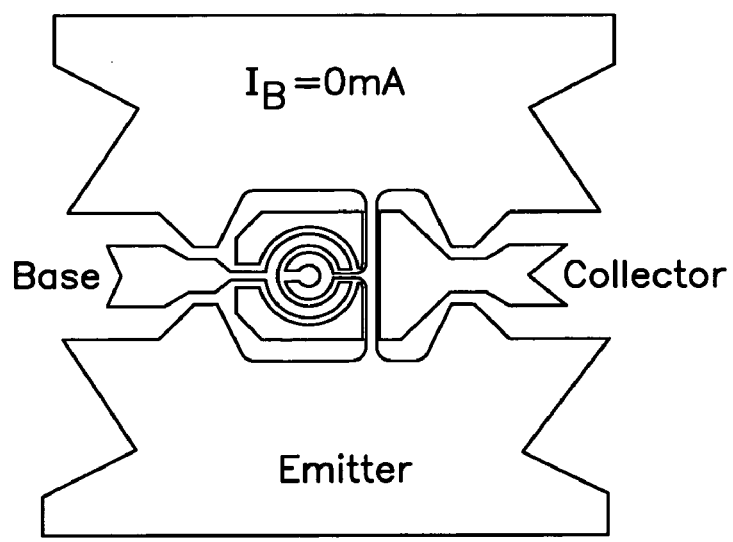
FIG. 23(a) is a top CCD image of the layout of the QW InGaP/GaAs HBT of FIG. 22.
Figure 23B:
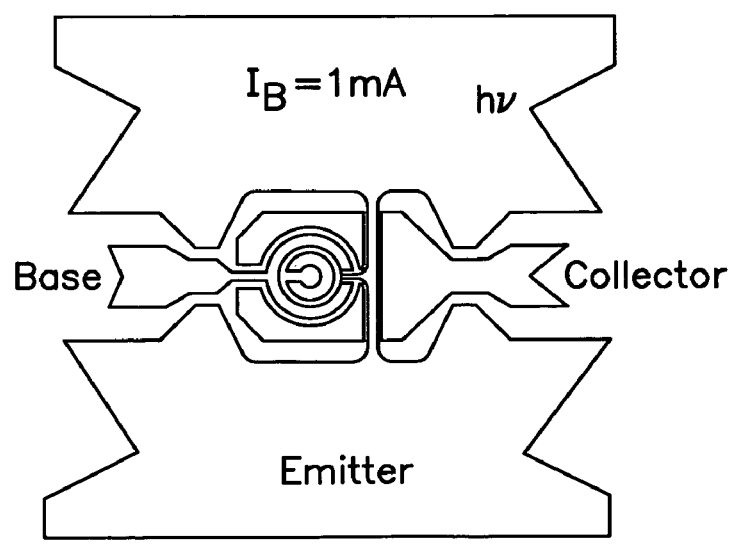
FIG. 23(b) is a top CCD image of the QW HBT light emission in the common emitter configuration of current bias (normal transistor operation, $I_B$=1 mA).
Figure 24:
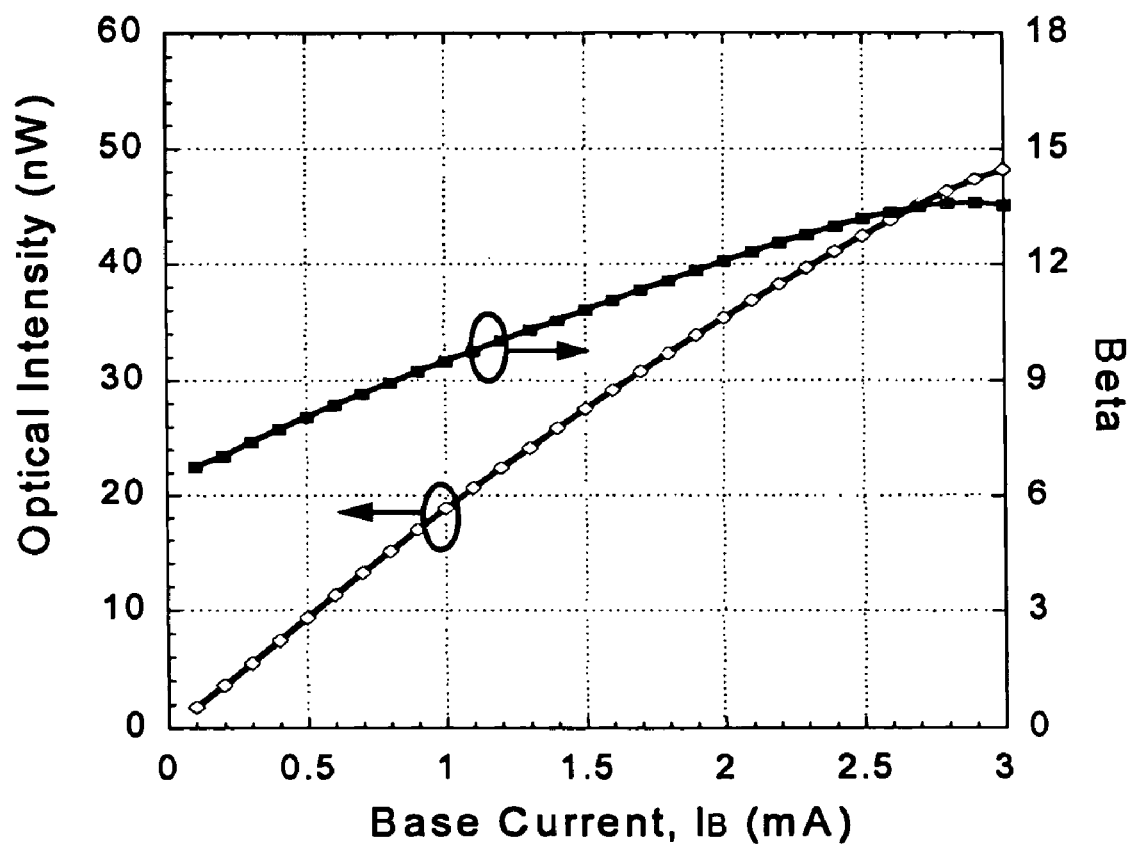
FIG. 24 shows the optical output intensity (power) of the QW HBT of FIG. 22 as a function of base current, demonstrating a nearly linear increase with current. The DC beta ($\beta=I_c/I_b$) is also shown and is seen to change from 7 to 13 as the base current increases.

FIG. 23(a) shows the top view layout of the 45 µm-diameter HBT, and FIG. 23(b) shows, via a microscope equipped with a charge-coupled device detector, a view of the same HBT with obvious spontaneous light emission (recombination radiation) from the base layer in the open area of the base to emitter region. Forward bias was used separately (data not shown) on the emitter-base (E-B) junction to merely reveal the light-emitting aperture of the HBT. It is also clear that no spontaneous light emission is seen in the open area of the base to collector region under reverse biased operation of the collector-base (C-B) junction because any electron near the HBT collector junction is swept out and does not have time to recombine with a hole in the base. In other words, HBT light is observed in the E-B base region, not the C-B region. FIG. 24 demonstrates nearly a linear relationship of output optical emission intensity (recombination radiation) as a function of base current. In this example less than 31% of the light emission from the LET could be collected since the multimode fiber diameter is 25 μm diameter. For a QW base HBT, the common-emitter DC current gain beta ($\beta=\Delta\Delta I_C/\Delta I_B$) is $\beta=13.5$ ($I_B=3$ mA, $I_C=40.5$ mA), and the corresponding common-base DC current gain alpha ($\alpha=\Delta I_C/\Delta I_E$) is nearly 0.93.

Figure 25:
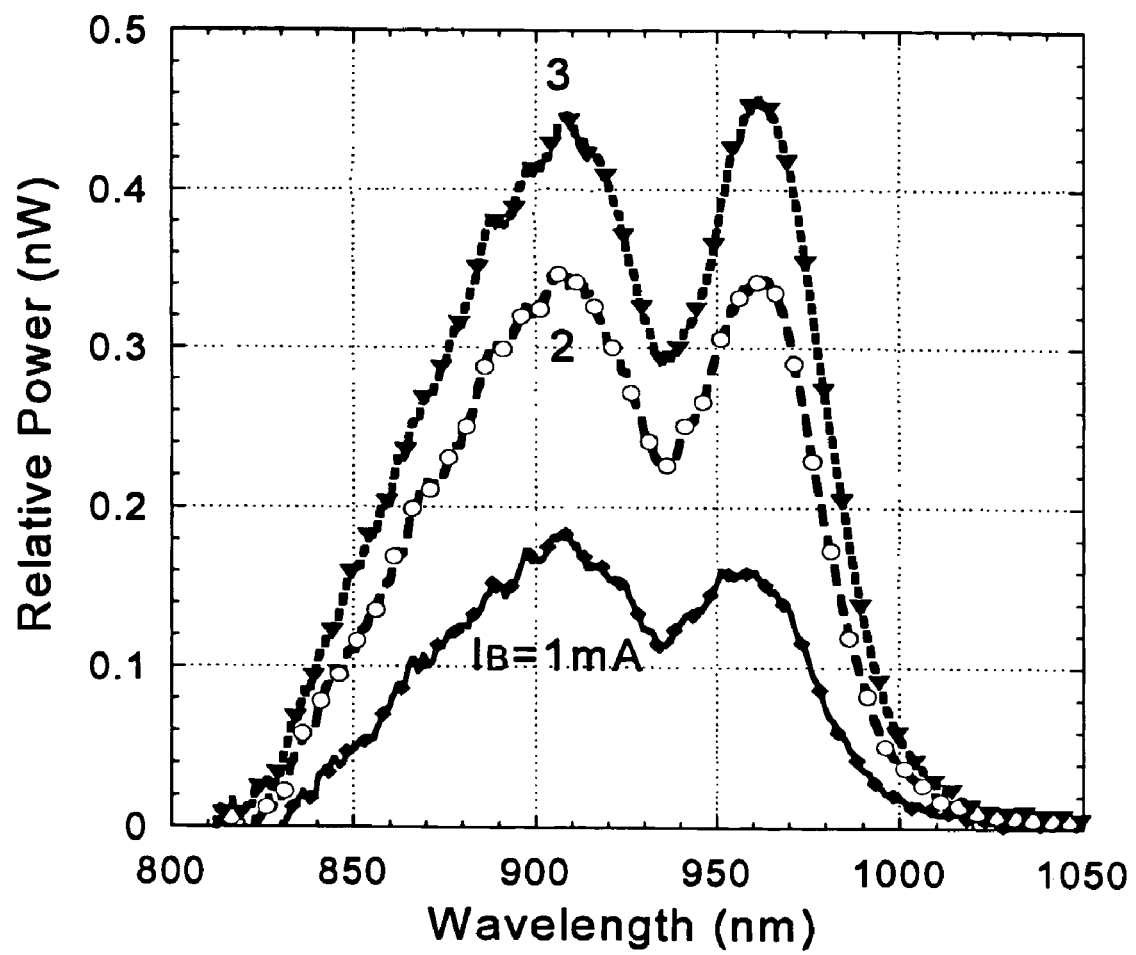
FIG. 25 shows graphs, for $I_B$ equal to 1, 2, and 3 mA, of emission wavelength due to band-to-band recombination in the p-type GaAs base and the base InGaAs quantum wells of the QW HBT of FIGS. 22 and 23.

The light emission wavelength of the device operating as an HBT (see FIG. 25) is centered near 910 nm for the band-to-band recombination transition of GaAs and 960 nm for the InGaAs QW transition. The shift in peak light emission towards longer wavelength (from the gap $E_g$) for both GaAs and the InGaAs QWs can be attributed to donor impurity tail states ($N_D>4\times10^{18}$ cm$^{-3}$) occurring during the growth of the heavily doped p-type base ($N_A=4\times10^{19}$ cm$^{-3}$). The light emission extends from 825 to 910 nm due to hot-electron injection from the InGaP emitter into the p-type GaAs base, and subsequent relaxation and recombination resulting in longer wavelength emission.

Figure 26:
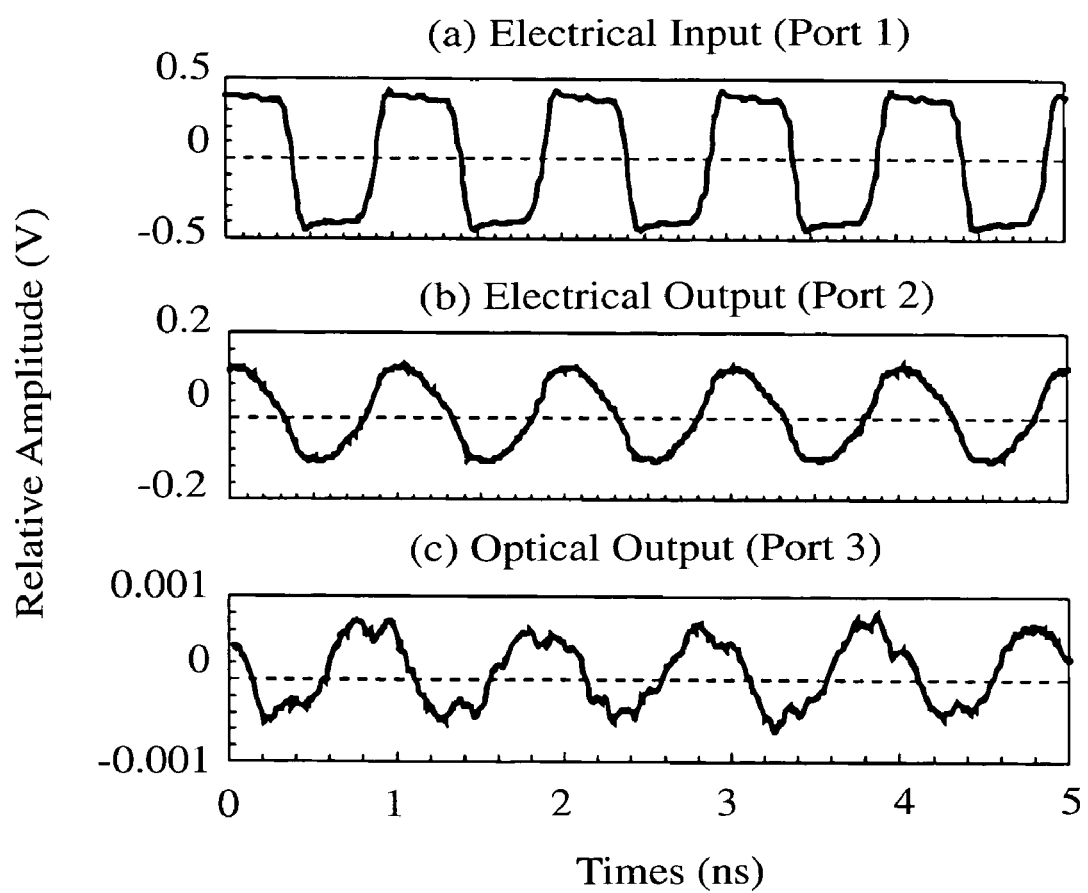
FIG. 26 illustrates three-port operation of the QW HBT of FIGS. 22 and 23 biased in the common emitter configuration: (a) a 1 GHz input signal (upper trace, port 1), (b) amplified output signal (middle trace, port 2), and (c) optical output modulated at 1 GHz (lowest trace, port 3).

A pattern generator produced an AC input signal at 1 GHz for a light output modulation test. The HBT light was coupled into a multimode fiber probe with a core diameter of 25 μm and captures only a small fraction of the light. The light was fed into a silicon avalanche photodetector (APD) equipped with a 20-dB linear amplifier. The 3 dB bandwidth of the APD with a linear amplifier was 700 MHz. For a 45 μm-diameter HBT, the current gain cutoff frequency, $f_t$, was measured at 1.6 GHz. The power gain cutoff frequency, $f_{max}$, was 500 MHz. FIG. 26 shows traces from a four channel sampling oscilloscope and illustrates three port operation. The top trace (a) is the input signal (at port 1) modulated at 1 GHz with a peak to peak amplitude of 0.5 V and the second trace (b) is the peak to peak output voltage amplitude of 0.17 V (at port 2) with the common-emitter HBT biased at $I_B=3$ mA and collector-to-emitter (CE) bias $V_{CE}=2.5$ V. The third trace (c) shows the output optical signal modulated at 1 GHz (at port 3) with peak-to-peak amplitude of 1 mV. The optical output of an LET can be modulated faster than the power gain cutoff frequency, $f_{max}$, and, in fact, can also be faster than the current gain cutoff frequency, $f_t$, of the HBT since the base recombination process is much shorter than the delay time of the forward transit time of the HBT. This example, with quantum-well enhancement of HBT base recombination, establishes high speed three-port operation of a quantum well(s) HBT in the common-emitter bias configuration.

Figure 27:
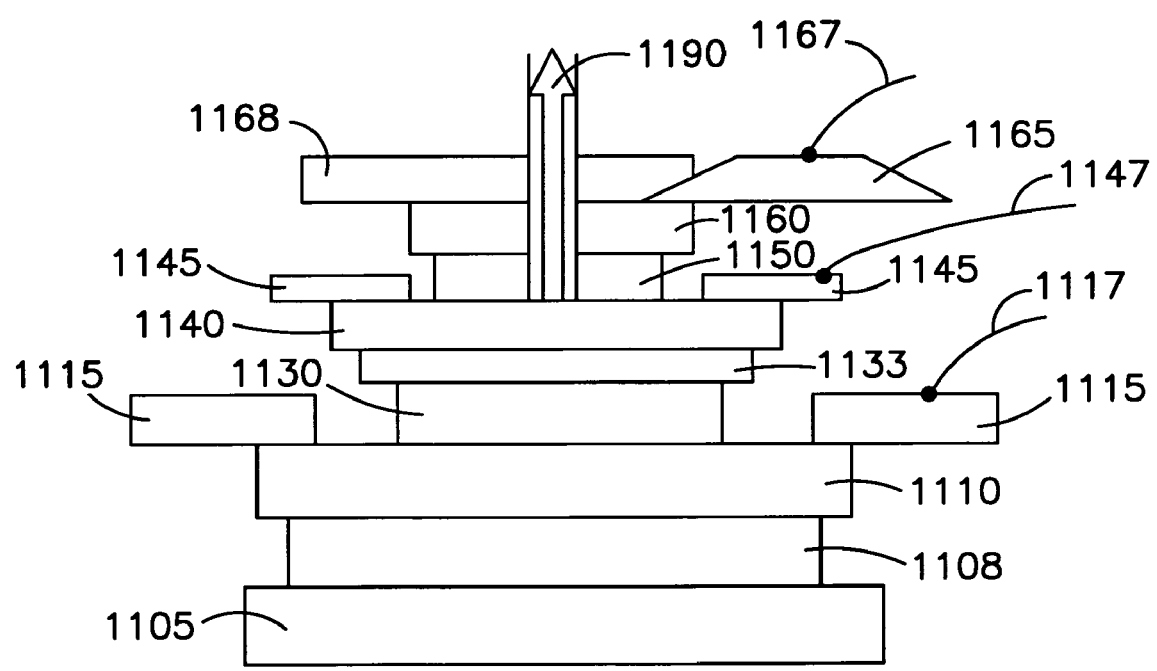
FIG. 27 is a simplified cross-sectional diagram, not to scale, of a vertical cavity surface emitting laser in accordance with an embodiment hereof.

FIG. 27 shows a vertical cavity surface emitting laser in accordance with an embodiment hereof which employs light emission from the base region of an HBT. A substrate 1105 is provided, and the following layers are provided thereon. DBR reflector layer 1108, subcollector 1110, collector 1130, transition layer 1133, base 1140, emitter 1150, emitter cap layer 1160 and top DBR reflector layer 1168. Also shown are collector metallization 1115, base metallization 1145, and emitter metallization 1165. Collector lead 1117, base lead 1147, and emitter lead 1167 are also shown. In a form of this embodiment, the layers are grown by MOCVD, the substrate 1105 is a semi-insulating InP substrate, subcollector 1110 is n+ InGaAs, collector 1130 is n–InP, the base 1140 is a p+ InGaAs layer with a quantum well, the emitter 1150 is n-type InP, and the emitter cap 1160 is n+ InGaAs. Also, the transition layer is an n-type quaternary transition layer, for example InGaAsP. In this embodiment, the reflector layers 1108 and 1168 are multiple layer DBR reflectors, which can be spaced apart by suitable distance, such as a half wavelength. In operation, as before, with signals applied in three terminal mode, modulation of the base current produces modulated light emission, in this case vertically emitted laser light represented by arrow 1190. As above, it will be understood that other configurations and material systems can be used, including, as examples, GaAs and GaN based HBTs, or other direct bandgap material systems. Also, the base layer 1140 can be provided with quantum well(s) or dot layer(s), as described elsewhere herein.

Figure 28:
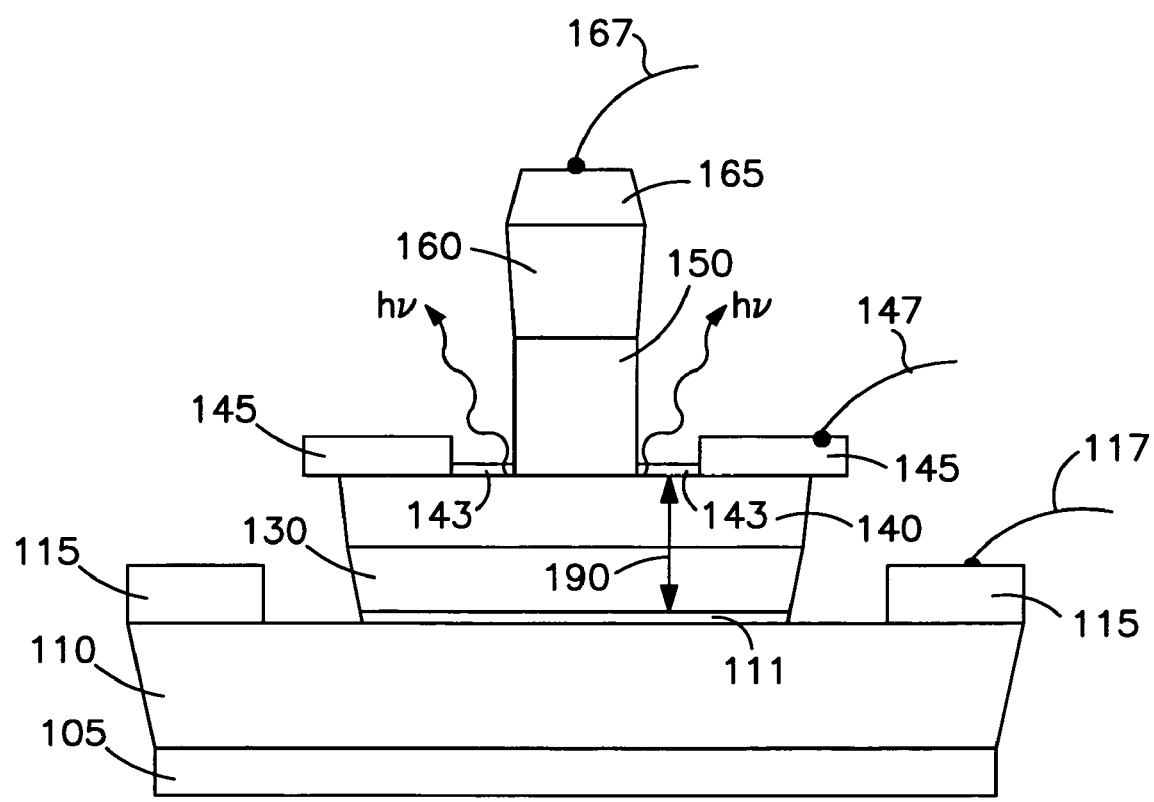
FIG. 28 is a simplified cross-sectional diagram, not to scale, of a vertical cavity surface emitting laser in accordance with a further embodiment hereof.

FIG. 28 shows a further embodiment of a vertical cavity surface emitting laser, which has a Bragg reflector as close as possible to the collector and with elimination of intervening lower gap absorbing layers between the DBRs. In particular, in FIG. 28 (which has like reference numerals to FIG. 1 for corresponding elements), the lower DBR is shown at 111, and an upper DBR is shown at 143. Arrow 190 represents the optical standing wave of the VCSEL. The DBR 141 can be a deposited Si—SiO$_2$ Bragg reflector. A further reflector can also be provided on the top of emitter 150. Again, the base layer 140 can be provided with quantum well(s) or dot layer (s), as described elsewhere herein.

Figure 29:
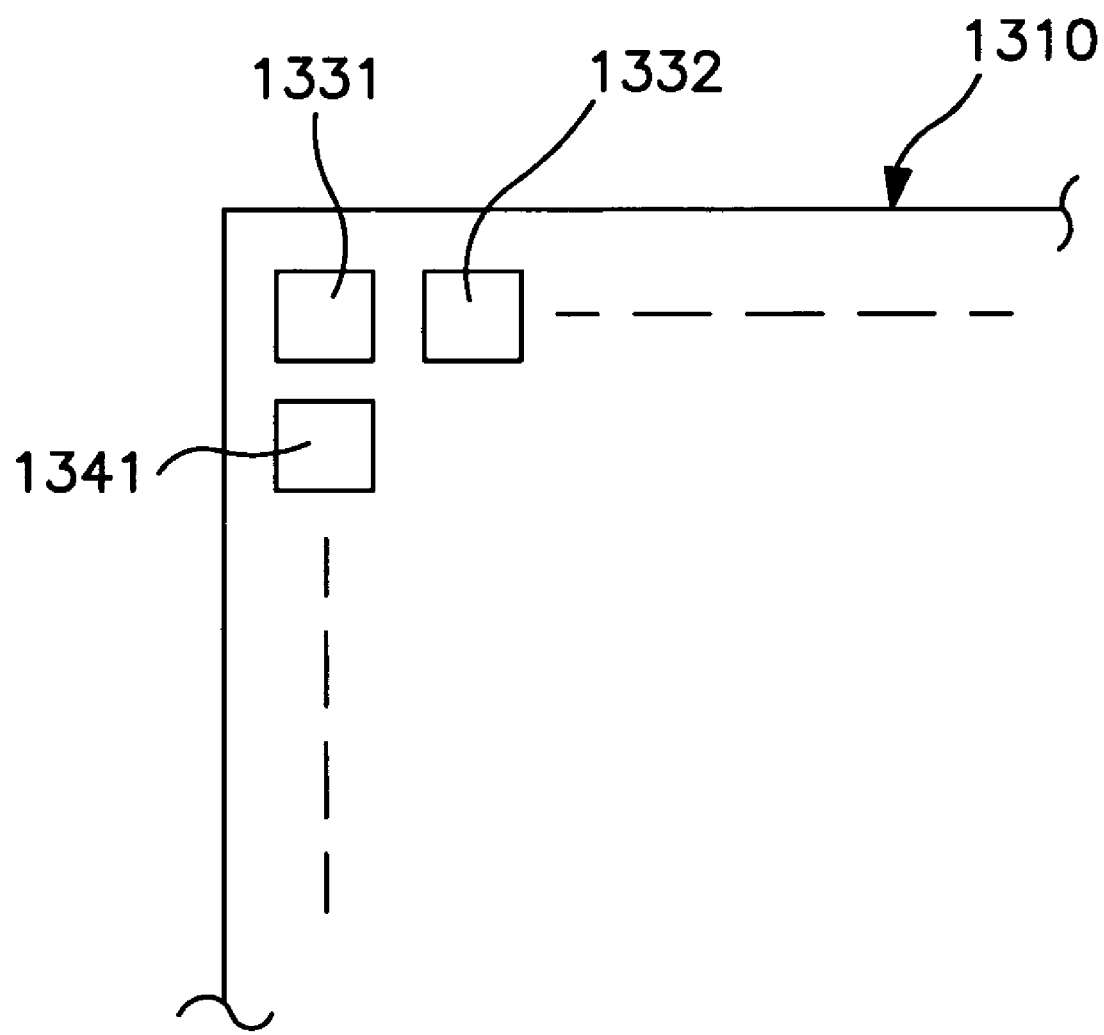
FIG. 29 is a simplified diagram of an array in accordance with an embodiment hereof.

FIG. 29 shows a display 1310 using an array of light-emitting HBTs 1331, 1332, 1341, etc. The light output intensities can be controlled, as previously described. Very high speed operation can be achieved, with or without useful light emission from some devices. Devices and arrays of these elements can be employed in integrated optics and electronics systems.

Figure 30A:
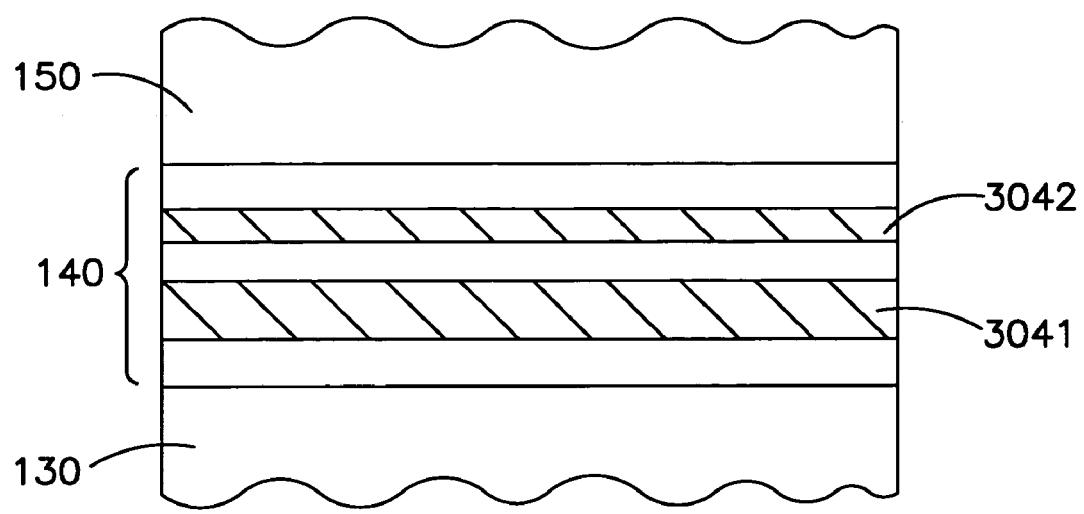
FIG. 30A is a cross-sectional broken-away view, not to scale, of a device in accordance with an embodiment of the invention and which can be used in practicing an embodiment of the method of the invention.
Figure 30B:
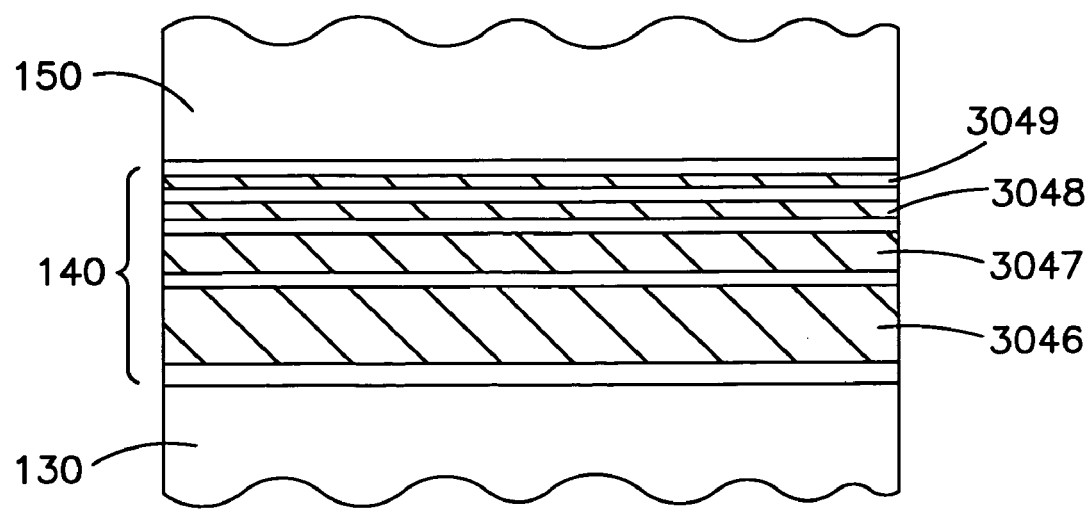
FIG. 30B is a cross-sectional broken-away view, not to scale, of another device in accordance with an embodiment of the invention and which can be used in practicing an embodiment of the method of the invention.

In FIG. 30A, the base region 140 of a bipolar transistor (for example the heterojunction biopolar light-emitting transistor of FIG. 1) includes a first relatively thicker quantum well 3041 in relatively closer proximity to the collector region 130, and a second relatively thinner quantum well 3042 in relatively closer proximity to the emitter region 150. The grading of well geometry is used to promote carrier transport from the emitter toward the collector. (Regarding a graded energy gap for GaAs wells alternating with AlAs barriers in a laser diode, see N. Holonyak "Quantum-Well And Superlattice Lasers: Fundamental Effects" pp. 1-18, in "The Physics Of Submicron Structures", Plenum Press, 1984). The quantum well regions 3041 and/or 3042 could alternatively be quantum dot regions, or one could be a quantum well region and another could be a quantum dot region. The regions 3041 and 3042 can also, if desired, have different compositions. Also, the spacings between quantum wells (and/or quantum dot regions) can be varied in thickness and/or in compositions. This form of the invention will be further understood from the embodiment shown in FIG. 30B, in which the base region 140 includes spaced-apart quantum wells 3046, 3047, 3048 and 3049. In an example of this embodiment, the quantum well 3046 nearest the collector is 80 Angstroms thick, the next quantum well (3047) is 40 Angstroms thick, the next quantum well (3048) is 20 Angstroms thick, and the quantum well 3049 (which is closest to the emitter 150) is 10 Angstroms thick. In this example, the spacings or barriers between quantum wells are in the range between about 5 to 50 Angstroms, and are not necessarily all the same. An injected electron is captured in a smaller well, tunnels into the next bigger well, and then the next bigger well, and so forth, until, at the biggest well closest to the collector, it tunnels to and relaxes to the lowest state of the biggest well and recombines. The arrangement of wells encourages carrier transport unidirectionally from emitter toward collector. Maximum recombination and light are derived from the biggest well as near as possible to the collector, which is an advantageous position, such as for optical cavity reasons. Carriers diffuse "downhill" in energy; i.e., toward the thicker wells. The asymmetry in well size provides improved directionality and speed of carrier transport. In embodiments as a light emitting HBT, light emission and device speed are both enhanced. As before, any or all of the quantum wells can be quantum dot regions, and/or can be of different compositions than the other quantum well (or dot)

regions. Also, it will be understood that other numbers of wells can be used and that some of the quantum wells (or dot regions, as the case may be) in the base region can have the same thicknesses as other quantum wells in the base region.

The principles hereof can also potentially have application to indirect bandgap materials (such as Ge and Si) in an HBT with a heavily doped base region, and with an optical port that is optically coupled with the base region. The light produced will generally be of less intensity than that produced by the direct bandgap HBT light emitters hereof. However, it may be useful to have this light generating and coupling capability in Ge—Si systems for various applications, including devices having one or more quantum wells and/or one or more quantum dot regions for enhancing recombination.

The invention claimed is:

1. A semiconductor device, comprising:
   a bipolar transistor having a base region between collector and emitter regions;
   means for coupling electrical signals with said collector, base, and emitter regions; and
   a plurality of spaced apart quantum size regions in said base region, including a first quantum size region in relatively closer proximity to said collector region and a second quantum size region in relatively closer proximity to said emitter region, said first quantum size region being thicker than said second quantum size region.

2. The device as defined by claim 1, wherein said quantum size regions are quantum wells.

3. The device as defined by claim 1, wherein said quantum size regions are quantum dot regions.

4. The device as defined by claim 1, wherein at least one of said quantum size regions is a quantum well and wherein at least one of said quantum size regions is a quantum dot region.

5. The device as defined by claim 1, wherein said bipolar transistor is a heterojunction bipolar transistor.

6. The device as defined by claim 1, wherein said at least some of said plurality of quantum size regions having different thicknesses are different in thickness by at least 10 Angstroms.

7. The device as defined by claim 2, wherein said at least some of said plurality of quantum wells having different thicknesses are different in thickness by at least 10 Angstroms.

8. The device as defined by claim 1, wherein said first quantum size region is at least 10 Angstroms thicker than said second quantum size region.

9. The device as defined by claim 8, wherein said base region is p-type semiconductor.

10. The device as defined by claim 8, wherein said base region is direct bandgap semiconductor highly doped p-type and said quantum size regions are of wider bandgap material than the material of said base region.

11. The device as defined by claim 10, wherein said quantum sized regions are substantially undoped.

12. A semiconductor light emitting device, comprising:
    a heterojunction bipolar transistor having a base region between collector and emitter regions;
    means for coupling electrical signals with said collector, base, and emitter regions; and
    a plurality of spaced apart quantum size regions in said base region, at least some of said plurality of quantum size regions having different thicknesses, said plurality of quantum size regions including a first quantum size region in relatively closer proximity to said collector region and a second quantum size region in relatively closer proximity to said emitter region, said first quantum size region being thicker than said second quantum size region.

13. The device as defined by claim 12, wherein said quantum size regions are quantum wells.

14. The device as defined by claim 12, wherein said quantum size regions are quantum dot regions.

15. The device as defined by claim 12, wherein at least one of said quantum size regions is a quantum well and wherein at least one of said quantum size regions is a quantum dot region.

16. The device as defined by claim 12, wherein said at least some of said plurality of quantum size regions having different thicknesses are different in thickness by at least 10 Angstroms.

17. The device as defined by claim 12, wherein said first quantum size region is at least 10 Angstroms thicker than said second quantum size region.

18. The device as defined by claim 12, further comprising an optical cavity enclosing at least a portion of said base region, and wherein said light emitting transistor is a transistor laser.

* * * * *